United States Patent [19]

Thomas, Jr.

[11] Patent Number: 5,073,907

[45] Date of Patent: Dec. 17, 1991

[54] DIGITAL PHASE-LOCK LOOP

[75] Inventor: Jess B. Thomas, Jr., La Canada, Calif.

[73] Assignee: California Institute of Technology, Pasadena, Calif.

[21] Appl. No.: 472,607

[22] Filed: Jan. 30, 1990

[51] Int. Cl.$^5$ ............................................. H03D 3/24
[52] U.S. Cl. .................................... 375/120; 375/96; 331/1 R
[58] Field of Search ...................... 375/81, 82, 83, 96, 375/120, 97; 364/724.18, 724.01; 331/1 A, 1 R, 25; 328/141; 329/307, 308, 309

[56] References Cited

U.S. PATENT DOCUMENTS

| | | | |
|---|---|---|---|
| 4,426,712 | 1/1984 | Giorski-Popiel | 375/96 |
| 4,769,816 | 9/1988 | Hochstadt et al. | 375/83 |
| 4,794,341 | 12/1988 | Barton et al. | 375/96 |
| 4,821,294 | 4/1989 | Thomas, Jr. | 375/96 |
| 4,888,564 | 12/1989 | Ishigiaki | 375/120 |
| 4,890,305 | 12/1989 | Devries | 375/82 |

OTHER PUBLICATIONS

A Survey of Digital Phase-Locked Loops, by William C. Lindsey and Chak Ming Chie, Proceedings of the IEEE, vol. 69, No. 4, Apr. 1981, pp. 410-431.
Design and Performance of Sampled Data Loops for Subcarrier and Carrier Tracking, by S. Aguirre and W. J. Hurd, TDA Progress Report 42-79, Jul.-Sep. 1984, pp. 81-95.
A Comparison of Methods for DPLL Loop Filter Design, by S. Aguirre, W. J. Hurd, R. Kumar and J. Statman, TDA Progress Report 42-87, Jul.-Sep. 1986, pp. 114-124.

Primary Examiner—Stephen Chin
Attorney, Agent, or Firm—Leonard Tachner

[57] ABSTRACT

An improved digital phase lock loop incorporates several distinctive features that attain better performance at high loop gain and better phase accuracy. These features include: phase feedback to a number-controlled oscillator in addition to phase rate; analytical tracking of phase (both integer and fractional cycles); an amplitude-insensitive phase extractor; a more accurate method for extracting measured phase; a method for changing loop gain during a track without loss of lock; and a method for avoiding loss of sampled data during computation delay, while maintaining excellent tracking performance. The advantages of using phase and phase-rate feedback are demonstrated by comparing performance with that of rate-only feedback. Extraction of phase by the method of modeling provides accurate phase measurements even when the number-controlled oscillator phase is discontinuously updated.

20 Claims, 20 Drawing Sheets

DIGITAL PHASE-LOCK LOOP

ORIGIN OF INVENTION

The invention described herein was made in the performance of work under a NASA contract, and is subject to the provisions of Public Law 96-517 (35 USC 202) in which the Contractor has elected to retain title.

TECHNICAL FIELD

The present invention relates to improvements in digital phase-lock loop (DPLL) design, including amplitude-insensitive phase extraction, feedback to NCO of phase in addition to phase-rate, more accurate computation of measured phase and a method for eliminating loss of sampled data during computation time.

BACKGROUND ART

A digital phase-lock loop DPLL is a device that tracks and extracts the phase of a sampled signal. By way of example, reference may be made to the following three publications which provide a survey of the prior art of digital phase-lock loop technology: A Survey of Digital Phase-Lock Loops by W. C. Lindsey and C. M. Chie, Proceedings of IEEE, volume 69, number 4, page 410, April 1981; Design and Performance of Sampled Data Loops for Subcarrier and Carrier Tracking by S. Acquirre and W. J. Hurd, TDA Progress Report 42-79, page 81, July 1984; and a Comparison of Methods for DPLL Loop-Filter by S. Acquirre and W. J. Hurd, TDA Progress Report 42-87, pp. 114, July, 1986.

The major components of a standard phase-lock loop are a number-controlled oscillator (NCO), a signal counter-rotator, an adder, a phase extractor, and a loop filter. An NCO is a component that generates a sinusoidal output based on phase and phase-rate registers. For each sample point, the phase register is incremented by the value in the rate register and the resulting phase is used to generate sine and cosine values that comprise the NCO phase. The sampled signal is counter-rotated (multiplied) with this NCO phasor and the complex product is accumulated over an interval. A phase extractor produces a measure of the phase of the resulting complex sum and this phase error signal is a measure of the difference of the actual phase and the NCO phase over the interval. The loop filter processes this phase-error value along with previous values to obtain a new estimate of phase rate. This phase-rate value is inserted in the phase-rate register of the NCO in order to improve the rate value in subsequent counter-rotation. Phase is measured at a given time point by reading the NCO phase register at that time point. Integer cycles of NCO phase are obtained with a counter that keeps track of the integer-cycle overflow of the NCO fractional-cycle phase register. Loop lock is obtained by sweeping the NCO phase rate until the signal is acquired.

SUMMARY OF THE INVENTION

The design of the digital phase-lock loops in the present invention emphasizes accuracy of output phase and performance at high loop gain. Even though emphasis was also placed on algorithm efficiency, minimizing computation and memory requirement was given secondary consideration relative to accuracy and performance. The loop designs of the present invention allow higher loop gains, which is a desirable option in applications where a lower limit must be placed on the NCO-update interval, T, but where dynamics requires a loop bandwidth $B_L$ such that $B_L T$ is greater than 0.1. Loop gain in the present invention can be increased beyond the range allowed in other, prior art DPLL designs because of one or more of the following features: First, an amplitude-insensitive phase extractor is used which avoids the requirement for a large gain margin; second, the phase error signal from a given interval is used immediately to help update the NCO for the next interval; third, the NCO is updated in both phase and rate rather than rate alone.

Maximum loop gain is determined for each DPLL design on the basis of two criteria: root-su,-square (RSS) transient response and the onset of lingering oscillations, both following a phase step. These two criteria provide a more conservative and realistic method for setting maximum gain than the computation of the point at which a pole of the transfer function crosses the unit circle. Besides elimination of the gain-margin requirement, another important advantage of the present invention is gained by utilizing amplitude-insensitive phase extractor. When an unnormalized sine phase extractor is used, signal-amplitude fluctuations can change the effective value for loop bandwidth and damping factor. If the fluctuations are sufficiently large, loop response to dynamics can deviate substantially from expected performance. Amplitude-insensitive phase extractors, on the other hand, allow the precise implementation of fixed values for loop bandwidth and damping factor. When loop bandwidth and damping factor are independent of signal-amplitude fluctuations, optimal loop constants can be selected for a given application with the knowledge that they will not vary during a track unless they are updated (for example, on the basis of the most recent SNR and dynamics).

Accuracy of measured phase can sometimes be improved in dynamic applications (i.e. applications with significant tracking errors) by two changes to the classical DPLL. First, when SNR is adequate, an arctangent phase extractor can be used to extract residual phase, which avoids the errors due to the nonlinear response of sine phase extractor. Second, measured phase for an integration interval can be obtained by adding observed residual phase to effective model phase so that the tracking error for the interval is not ignored in the loop-output phase. This operation removes from loop-output phase, for example, the steady-state tracking error generated in a second-order loop by a constant acceleration. For an arctangent extractor to perform to expectations, SNR must be at moderate to high levels. When SNR is low and tracking errors are sufficiently small, a sine extractor could be preferable. To reduce the adverse effects of amplitude fluctuations, two normalization schemes for sine extractors are disclosed.

Methods are presented that allow change in loop gain during a track without loss of lock and that allow high-performance, next-interval feedback to the NCO without loss of data during computation time.

In the embodiment of the present invention disclosed herein, the high-speed operations performed at the input sample rate, such as NCO operations, phase counter-rotation and accumulation, are carried out by special purpose hardware. A tracking processor, which consists of special purpose hardware and/or a microprocessor, performs the less frequent operations such as phase extraction, loop-filter operations, computation of model phase (integer and fractional cycles), NCO feedback computation, computation of sum-interval start and stop times, and computation of output values for phase and time tag. Substantial consideration is given to timekeeping in order to emphasize the importance of time-tag precision. A design is disclosed herein for a real-time clock and control of loop timing.

OBJECTS OF THE INVENTION

It is therefore a principal object of the present invention to provide an improved digital phase-lock loop design which yields better accuracy and performance as compared to conventional prior art digital phase-lock loops.

It is an additional object of the present invention to provide an improved digital phase-lock loop design which incorporates feedback phase and rate rather than only rate.

It is still an additional object of the present invention to provide an improved digital phase-lock loop design with improved phase extractor.

It is still an additional object of the present invention to provide an improved digital phase-lock loop design which allows higher loop gains as compared to prior art digital phase-lock loops.

It is still an additional object of the present invention to provide an improved digital phase-lock loop design that allows processing of sampled signal during computation time without loss of data or increase in dynamic tracking error.

BRIEF DESCRIPTION OF THE DRAWINGS

The aforementioned objects and advantages of the present invention, as well as additional objects and advantages thereof, will be more fully understood hereinafter as a result of a detailed description of preferred embodiments when taken in conjunction with the following drawings in which.

DETAILED DESCRIPTION OF PREFERRED EMBODIMENTS

A. Basic Concepts and Definitions

Figure 1:
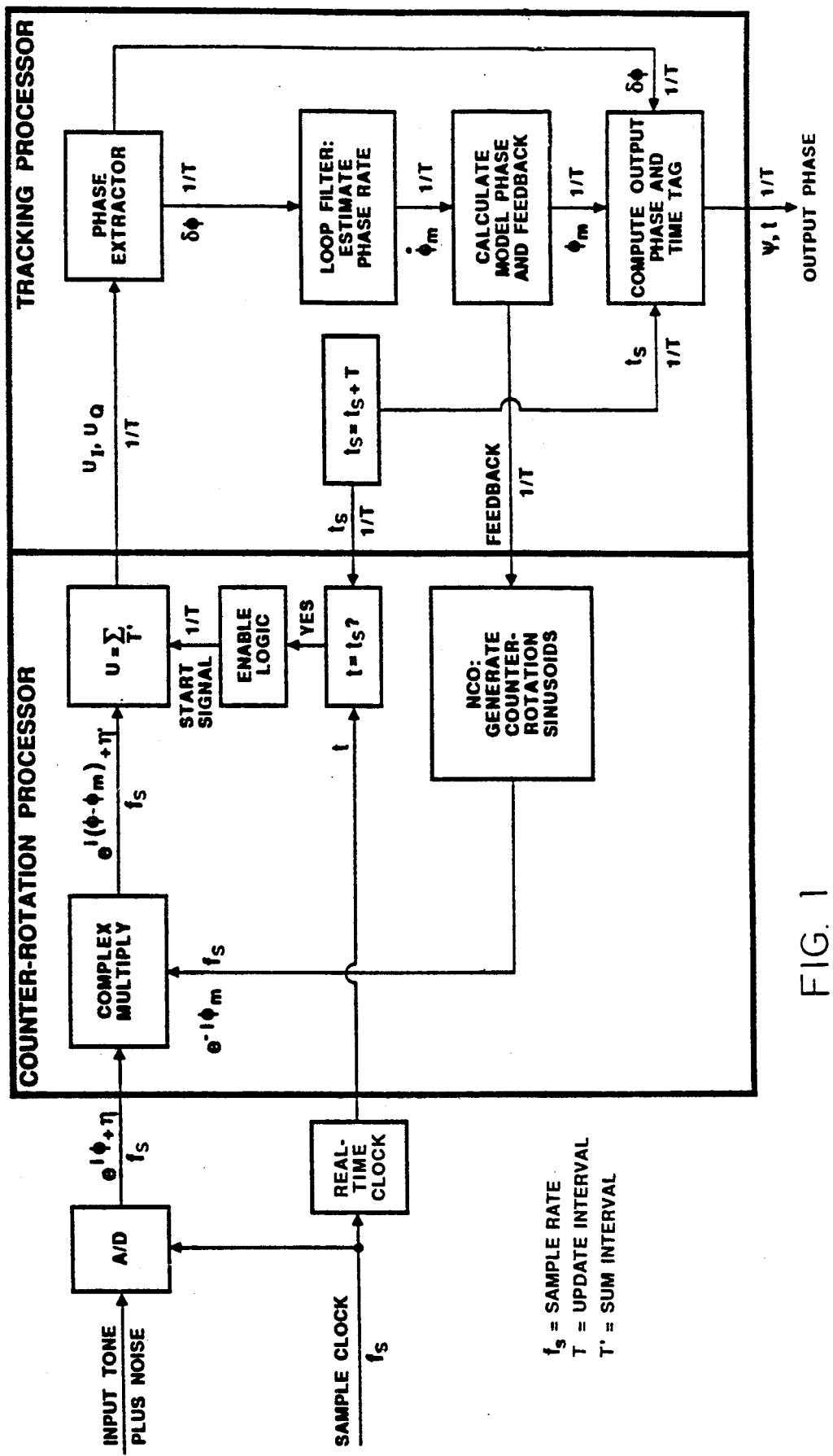
FIG. 1 is a high level block diagram of a typical digital phase-lock loop of the present invention.

Reference will first be made to FIG. 1, a generalized block diagram of a DPLL that defines the basic components in a loop. Then, specific designs for each component are described. Details, such as the number of levels in the digitized input signal and in the counter-rotation phasor, and the number of bits in phase registers, will not be specified. Since each application has its own accuracy and design requirements, these numbers can vary considerably from system to system. General symbols will be employed under the assumption that each quantity would be digitized in an actual system in a manner that reduces the effects of quantization, such as rounding and commensurability errors, to a negligible level after averaging and compensating processing have been applied. For similar reasons, implementation design will not be discussed even though a number of feasible implementation schemes can be devised for each component.

A.1 High-level Block Diagram

A high-level block diagram for a DPLL is shown in FIG. 1. The DPLL has been divided into two major components: a counter-rotation processor (CP) and a tracking processor (TP). The CP operations, which are carried out at the input sample rate by special-purpose, high-speed hardware, include NCO operations, a complex multiplication to counter-rotate, and a complex sum. The TP operations, which are carried out much less frequently (i.e. once each counter-rotation sum-interval) by either special-purpose hardware or a microprocessor, include a phase extractor, a loop-filter, model-phase computation, computation of NCO feedback, computation of start and stop times for the sums, and computation of measured phase and time-tag. TP operations can take place either in the dead-time between CP sum-intervals or concurrent with CP operations during a sum-interval, depending on the implementation. The following paragraphs contain a more detailed description of CP and TP operations.

Even though more complicated signals can be tracked by the techniques explained hereinafter, suppose for example that the incoming consists of a plus noise and is sampled in a quadrature (complex) mode at a uniform sample rate. (Nonquadrature sampling can be employed if the tone frequency is high enough to make the sum note average to a negligible level in the counter-rotation sum described below.) In the CP, the sampled signal is counter-rotated point by point by means of a complex multiplication with a stream of phasors generated by the NCO on the basis of feedback supplied by the TP. Over a sum-interval, the phase used to generate the counter-rotation phasors is a linear time function. When the loop is in lock, the complex multiplication counter-rotates both tone phase and phase rate to nearly zero values. The resulting complex products are then summed over all points in an interval of length T' to obtain an average counter-rotated phasor for the sum-interval. The sum compresses the data volume and improves SNR so that residual-phase can be more precisely extracted. The two components of the complex result are often referred to as the in-phase (I) and quadrature (Q) components to denote alignments of 0 degrees and 90 degrees, respectively, for the NCO phase relative to the input phase.

At the end of a sum-interval, the contents of the accumulators are passed to the TP and the accumulators are set to zero in preparation for the next interval. In the TP, a phase extractor computes a residual phase from the complex sum. This residual phase is then passed through a loop-filter to estimate the next value for phase rate. The resulting phase rate is then used to compute model-phase for the next interval and to calculate feedback needed to update the NCO for the next sum-interval. Based on the feedback for this interval, the NCO generates a model phasor for each sample point in the interval. The resulting stream of phasors is multiplied point-by-point by the sampled signal, thereby completing the loop.

In the DPLL embodiments of the present invention, the TP precalculates the model-phase to be applied by the NCO and keeps track of integer cycles of phase (with the integer part of the model-phase variable) as well as fractional cycles. (The NCO only tracks fractional cycles.) For every NCO update interval, the TP increments the start-time variable with the update interval, T, in preparation for activating the sum for the next interval. (In typical applications, the update interval and sum-interval are set by the TP to fixed values for a whole track.) Utilizing model-phase, residual phase, and the start-time variable, the TP extracts, after the completion of each update interval, a measured phase and time-tag for the interval.

As used herein, phase error signal refers to the phase value output by the phase extractor; residual phase is normalized phase error signal in cycles, tracking error refers to the difference of input phase and model-phase (NCO phase); residual phase is equal to tracking error plus the effect of noise from the current sum-interval; and dynamic tracking error refers to tracking error when SNR is "infinite".

DPLLs are characterized by a number of bandwidths. As summarized in Table I, the bandwidths that will be defined for DPLLs are sum bandwidth, loop parameter bandwidth, loop noise bandwidth, residual-phase bandwidth, loop-output bandwidth and compressed-phase bandwidth.

TABLE I

| Summary of Bandwidths In Digital Phase-Locked Loops | |
|---|---|
| Bandwidth Type | Single-Sided Bandwidth |
| Sum BW | $1/(2T')$ |
| Loop-Parameter BW | $B_L$ |
| Loop-Noise BW | $B_L^N$ |
| Residual-Phase BW | $B_L^N + 1/(2T)$ |
| Output-Phase BW | $1/(2T')$ or $B_L^N$ |
| Compressed-Phase BW | $\geq 1/(2T_a)$ |

$T'$ = sum interval
$T_a$ = compression (averaging) interval

Figure 2:
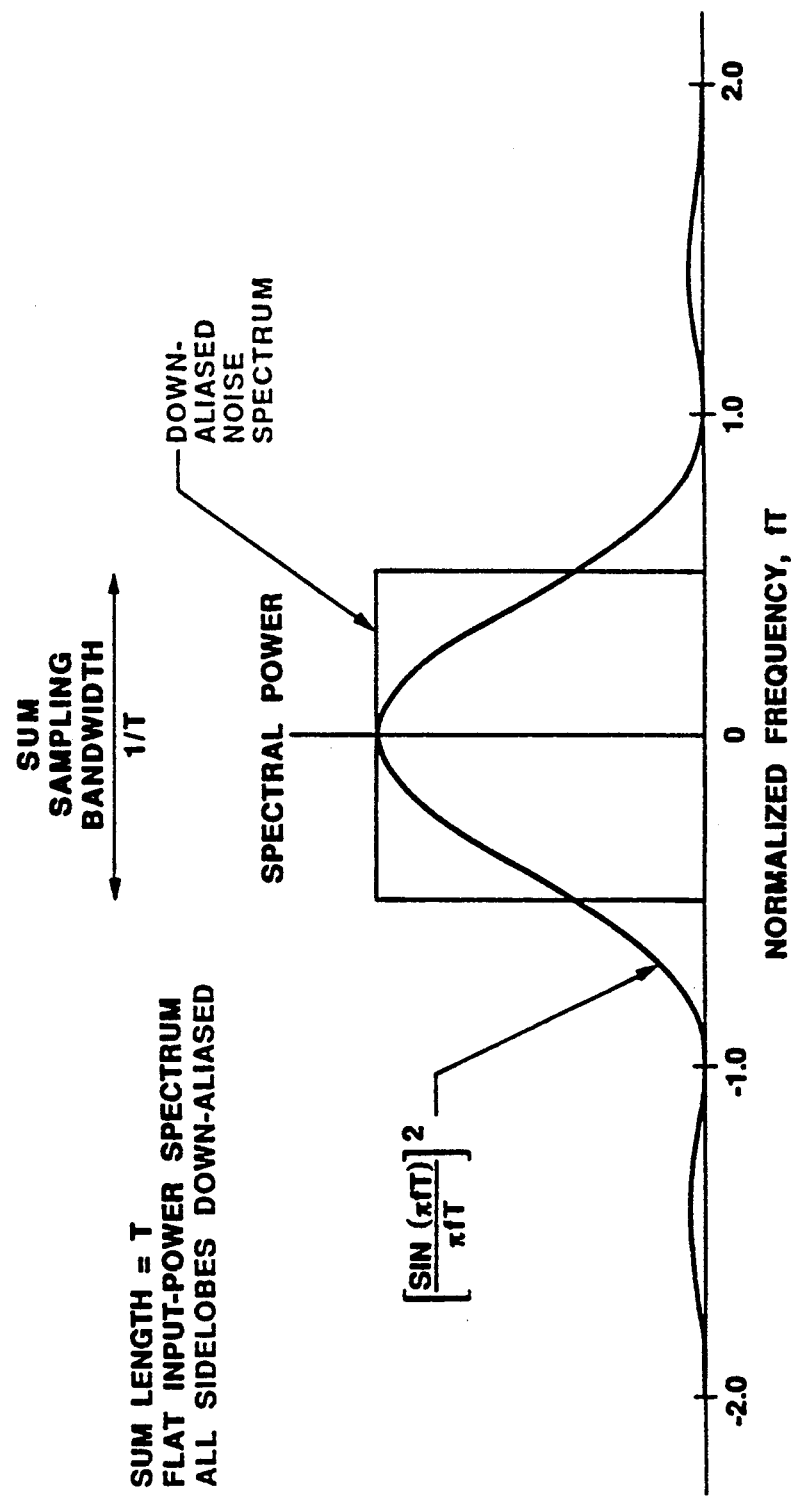
FIG. 2 is a graphical illustration of the noise power spectrum following sum and dump operation.

Sum bandwidth (accumulator bandwidth) is the effective single-sided noise bandwidth (SSNB) of a sum over an interval of length, T', and is given by $1/(2T')$. Since the filter shape for a sum is a sinx/x function with extensive sidelobes, down-aliasing can be applied to the sidelobes on the basis of the output sample range (1/T) of the sum-and-dump operation. It will be assumed that dead-time between sum-intervals is negligibly small here so that T' = T. FIG. 2 plots the (sinx/x) filter due to the sum, along with the effective noise spectrum after down-aliasing all sidelobes into the sampling bandpass of $-1/(2T)$ to $1/(2T)$. It is assumed here that the noise spectrum entering the sum is flat across all significant sidelobes. Note that, after aliasing, the effective spectrum is perfectly flat across the sampling bandpass as though it had been filtered with a perfect rectangular baseband filter with two-sided bandwidth of 1/T. This characteristic of aliased noise will be useful in computing loop noise bandwidth hereinafter. This aliasing result is based on the following relation:

$$\sum_{n=-\infty}^{\infty} \left[ \frac{\sin(n\pi + x)}{n\pi + x} \right]^2 = 1, \text{ all } x \quad (1)$$

Signal (voltage) amplitude after the CP sum is equal to the root-sum-square (RSS) of the I and Q components of the complex sum. Sum SNR, SNR, is defined as the signal amplitude divided by the root-mean-square (RMS) noise arising on either component during the sum-interval (i.e., noise with the sum bandwidth 1/(T')).

As the name implies, loop parameter bandwidth, $B_L$, does not physically exist anywhere in a DPLL circuit, but is only a parameter used in the computation of loop gain. As explained below, loop parameter bandwidth first appears when DPLL loop constants are formulated in a manner similar to analog loops, thereby imparting some parametric meaning to those constants. Loop noise bandwidth, $B_L^N$, is defined as in analog loops, namely as the effective SSNB of model (NCO) phase. When the loop parameter bandwidth is very small compared to 1/T, loop parameter bandwidth is approximately equal to loop noise bandwidth. Loop (voltage) SNR is equal to the signal-amplitude divided by the RMS noise arising on either component from the loop noise bandwidth.

Residual-phase bandwidth is defined as the SSNB of the noise on the residual-phase, and is equal to the sum of loop noise bandwidth and sum bandwidth. Loop-output bandwidth is the effective SSNB of the phase extracted from the loop every update interval and depends on how such loop-output is calculated, as explained below. Compressed-phase is computed by post-loop circuitry or software by "averaging" loop-output phase over many update intervals (for example, by a straight average or by a polynomial fit). Compression is applied when the loop-output rate is too high for the intended application. If the compression interval is $T_a$, the resulting data rate will be $1/T_a$ and the SSNB after compression typically will be of the order of $1/(2T_a)$. (With a straight average or a linear fit, the SSNB will be $1/(2T_a)$ and with a quadratic fit, the SSNB will be $1.5/(2T_a)$.)

A.2 Phase Extractor

We now analyze and compare two types of phase extractor: sine and arctangent.

A.2a Arctangent Extractor

An arctangent extractor obtains residual-phase in units of cycles by computing the phase angle defined by the two complex components of the CP sum. When the signal is a pure tone, a four-quadrant arctangent is applied to obtain a phase value between $-\frac{1}{2}$ and $+\frac{1}{2}$ cycles. With adequate SNR and accurate feedback, residual-phase will fall between $-\frac{1}{2}$ and $+\frac{1}{2}$ cycles and extracted phase will be a valid measure of residual-phase.

For low sum SNRs (e.g. $SNR_T = 1$), residual-phase extracted by an arctangent extractor can be corrupted by cycle ambiguities. When low SNR causes many ambiguities, the average response of an arctangent extractor changes from a sawtooth shape to a less accurate sine-like curve. As SNR approaches zero, an arctangent extractor loses all sensitivity and its average response approaches zero, even when $B_L T$ is small. For this reason, an arctangent extractor does not perform well when sum SNR is small. In effect, this characteristic of the arctangent extractor places a lower limit on the update interval, T, which in turn, places an upper limit on $B_L$ on the basis of loop instability.

A.2b Sine Phase Extractor

A sine phase extractor obtains residual-phase from the quadrature component of the CP sum, after accounting for tone amplitude in some way. When used in a conventional fashion, sine extractors rely on calibration and gain control to account for amplitude. Such sine extractors can suffer from unwanted amplitude variations and therefore require a gain margin. As discussed above, this defect lowers the upper limit for loop gain and can result in poorly determined loop gain, loop bandwidth, and damping. An ideal sine extractor is defined as being insensitive to amplitude variations, experiencing a negligible increase in noise due to amplitude normalization, and generating phase in units of cycles.

An ideal sine extractor can be approximated by using one of several normalization schemes. For a DPLL to be truly digital, normalization should be carried out digitally and should not depend on analog calibration and adjustment of amplitude. The most obvious digital normalization scheme is to divide the Q component by the RSS of the I and Q components of the current interval. With low SNRs, however, noise on such a normalization factor will be too large to allow approximation of the ideal sine extractor described above.

When amplitude is slowly varying, normalization algorithms can be implemented that average the results of previous intervals to reduce the effect of noise in the normalization factor. The algorithms could perform a running average of previous intervals so that each interval is normalized on the basis of the most recent intervals. Depending on the nature of the tracking errors, one of two approaches can be used to compute the normalization factor: noncoherent or coherent averaging. (Even though these schemes will operate at fairly low SNR, SNR cannot be extremely low. When SNR is extremely low, it may not be practical to sum over enough past points to lower noise on the amplitude measurement to an adequate level.)

Figure 3:
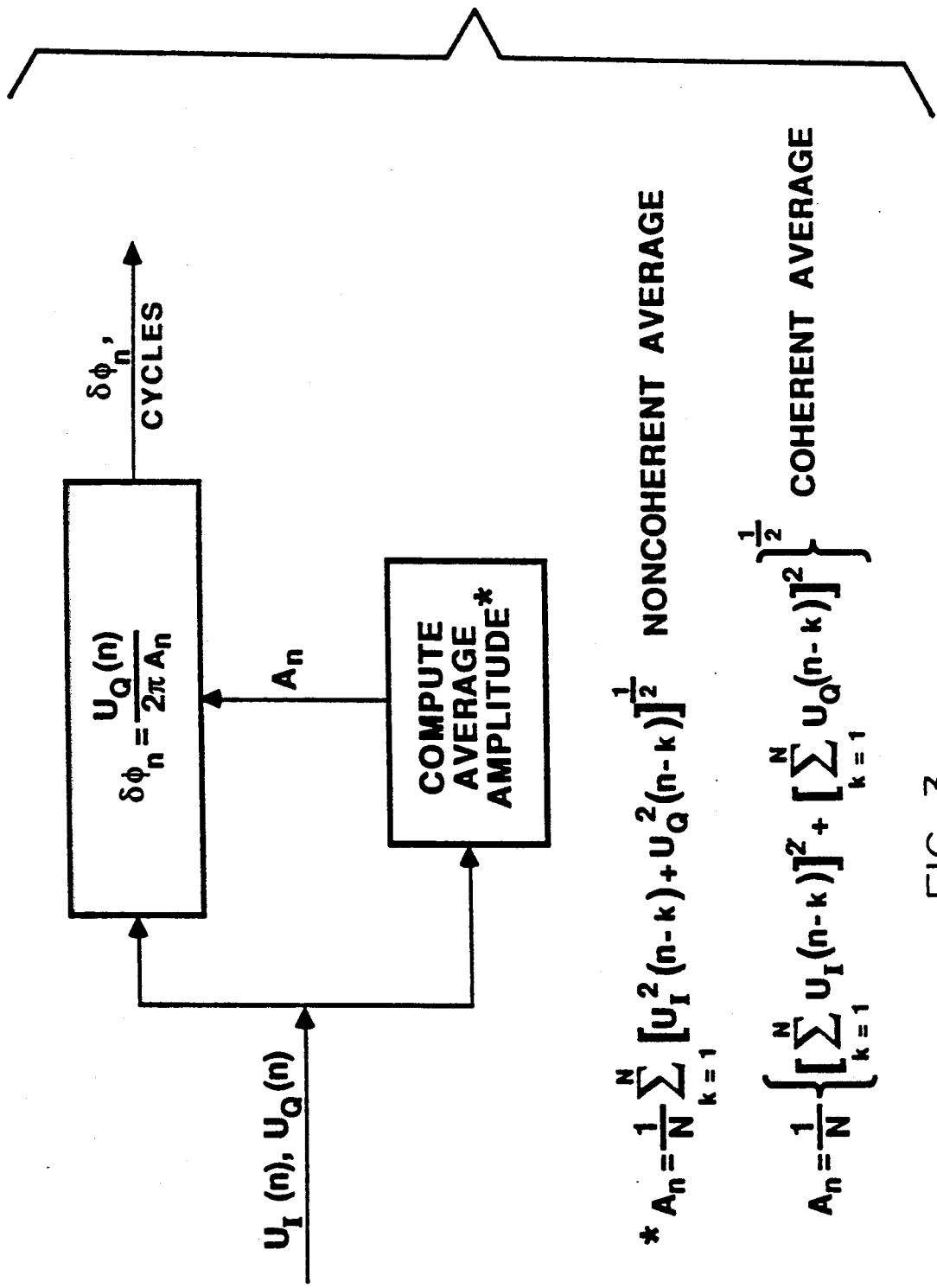
FIG. 3 is a block diagram of an amplitude-insensitive phase extractor used in the present invention.

If tracking errors are large and variable from one update interval to the next, the noncoherent averaging illustrated in FIG. 3 can be applied. In the noncoherent approach, the RSS amplitudes from a number of previous sum-intervals are averaged to reduce noise on the amplitude estimation. If $N_A$ intervals are averaged, noise will be improved by the square root of $N_A$. For example, if 100 previous intervals are averaged and in the voltage SNR for a sum-interval is $SNR_T = 3$, the 1-sigma noise error on the normalization factor will be about 3% rather than about 30%. Thus, loop gain, loop bandwidth, and damping will also be accurate to about 3%.

Note in FIG. 3 that the average of RSSs does not include the most recent interval. This omission allows the sum operations to be carried out in parallel with CP operations, thereby avoiding the need for dead-time operations in computing amplitude. Since a large number of previous intervals (e.g. 100) are needed to obtain a substantial reduction in noise, the omission of the most recent interval will result in a negligible loss of information.

At first glance, computation of a running average of amplitude would appear to be prohibitively lengthy. However, computation of the sum can be reduced to a few operations per update interval if some memory is sacrificed. If 100 points are averaged, for example, the RSS amplitude for each of the last 100 points can be stored in a 100-point array that is updated by means of an address pointer. The address pointer is incremented by one for each new point and "modulo'ed" with 100. When the RSS amplitude for the new point is stored in the array at the resulting modulo address, the previous amplitude is erased. Before it is erased, this "first sum amplitude" is subtracted from the amplitude sum and the new amplitude, the "last sum amplitude", is added. In this manner, each new value of the amplitude sum requires only a few operations for each new update interval: 1 addition, 1 subtraction, and a few housekeeping operations. There is an alternate approach that is less current but does not require the memory array. That approach would perform a sum over 100 points and continue to use that same average for the next 100 points while another average is being computed.

The noncoherent-average approach becomes unreliable when sum SNR is very small ($SNR_T < 1$) because the RSS amplitude computed for individual sum-intervals is then mostly averaged noise, with greatly reduced sensitivity to true amplitude. For small SNRs (e.g. $SNR_T = 1$ to 3), accuracy of normalization can be improved with an SNR translation table that relates the observed SNR derived from averaged RSS amplitude with "true" sum SNR based on actual amplitude. An SNR translation table is shown in Table II for true sum SNRs between 0.9 and 5. To use this Table, an observed SNR is computed on the basis of the averaged amplitudes and used along with Table II to estimate the ratio of true SNR to observed SNR. The resulting ratio is then multiplied by the noncoherent-average amplitude $A_n$, as computed in FIG. 3, to obtain an estimate of true amplitude. (It is assumed that a method for estimating observed SNR is implemented. Since different methods can be implemented for different systems, SNR computation will not be covered.) When true sum SNR is about 1 or less, the SNR translation becomes too inaccurate and the noncoherent approach must be abandoned.

TABLE II

Observed SNR After RSS vs. True SNR

| $SNR_{obs}$ (amplitude) | $SNR_{true}$ (amplitude) | $SNR_{true}/SNR_{obs}$ |
|---|---|---|
| 1.50 | 0.900 | 0.600 |
| 1.75 | 1.325 | 0.757 |
| 2.00 | 1.670 | 0.835 |
| 2.25 | 1.975 | 0.878 |
| 2.50 | 2.265 | 0.906 |
| 2.75 | 2.545 | 0.925 |
| 3.00 | 2.815 | 0.938 |
| 3.25 | 3.083 | 0.949 |
| 3.50 | 3.350 | 0.957 |
| 3.75 | 3.610 | 0.963 |
| 4.00 | 3.872 | 0.968 |
| 4.25 | 4.130 | 0.972 |
| 4.50 | 4.385 | 0.974 |
| 4.75 | 4.640 | 0.977 |
| 5.00 | 4.895 | 0.979 |

Even lower SNRs ($SNR_T < 1$) can be handled if both the tracking error and amplitude are slowly varying. In such cases, the I and Q components of the CP sums can be separately averaged, as illustrated in FIG. 3, thereby improving SNR through coherent combination. The RSS of the complex components of the resulting coherent average is computed for use as a normalization factor. Again, noise is improved by square root of $N_A$. If $SNR_T$ is 1 and if 1000 previous intervals are averaged, the 1-sigma error on the normalization factor will be 3%. Thus, loop gain, loop bandwidth, and damping will be also accurate to about 3%. The computation algorithms presented above for the noncoherent sum can also be applied to the coherent-sum components.

A.2c Comparison of Sine and Arctangent Extractors

Sine extractors can produce a distorted measure of tracking error that can compromise the accuracy goal for measured-phase. For example, a sine phase extractor becomes nonlinear when tracking error exceeds about 30 degrees. An arctangent extractor, on the other hand, is linear up to 180 degrees, provided SNR is adequate to allow such a large tracking error. This factor-of-six disadvantage of sine extractors can be overcome in some applications by taking advantage of the greater range of sum SNRs allowed by the sine extractor, as explained below.

When sum SNR is very low (e.g., $SNR_T = 1$), a sine phase extractor will greatly outperform an arctangent extractor. The superior performance of the sine extractor under these conditions is a result of the nature of the noise on extracted phase. For a sine extractor, noise from the interval just completed linearly enters the extracted phase as an additive term. When $B_LT$ is set to a small value (e.g., $B_LT < 0.01$), the loop-filter, in effect, averages this interval noise to a small value, without changing the sine response of the extractor, on average. Thus, a sine extractor can provide reliable tracking for small sum SNRs. This performance is to be contrasted with the deteriorating response of an arctangent extractor when SNR decreases, as explained above.

Because a sine extractor can handle smaller sum SNRs, the update interval can be set to much smaller values for that extractor, provided the particular implementation can handle the greater speed. Given a smaller update interval, one can set the loop parameter bandwidth to a larger value before experiencing disproportionate increases in loop noise bandwidth and loop instability due to high loop gain. A larger loop bandwidth leads to smaller tracking errors, which makes the 30-degree limit more feasible. The same loop parameter bandwidth may not be feasible with an arctangent extractor for the reasons outlined above.

A.3 Loop-Filter

The loop-filter combines the present and past values for residual-phase to obtain the next estimate for phase rate or, more accurately stated, for phase change over an update interval. A conventional second-order loop filter in a DPLL computes this phase change, in units of cycles, by means of the formula $$\Delta\phi_{n+1}^T = K_1\delta\phi_n + K_2 \sum_{k=1}^{n} \delta\phi_k \qquad (2)$$

where $K_1$ and $K_2$ loop filter constants and $\delta\phi_k$ is residual-phase for the kth interval in units of cycles. When expressed in terms of loop parameter bandwidth $B_L$, damping factor, r, and update interval, T, the first loop constant can be expressed as $$K_1 = 4B_LT\frac{r}{(r+1)} \qquad (3)$$

and the second in terms of the first as $$K_2 = \frac{K_1^2}{r} \qquad (4)$$

$K_2$ is determined by $K_1$ once a damping factor has been selected. $K_1$ will be referred to as the loop gain. (Note the difference between this definition of loop gain and that of conventional loop gain, which can be viewed as a factor multiplying both terms in Equation (2) $K_1$ is a more useful definition of loop gain when amplitude-insensitive phase extractors are used.) These definitions of loop constants assume that the phase variables in Equation (2) have consistent units (i.e., that residual-phase and estimated phase change are in units of cycles).

The damping factor is typically set in the range of 2 to 4, where 4 is critically damped. If r is very large, a first-order loop is obtained. The damping factor can be computed in terms of the damping ratio, $\zeta$, from the relation $r = 4\zeta^2$. $B_LT$ can range from very small values (e.g., 0.001) up to 0.45, depending on the application, as explained below. Given the large range of $B_LT$ relative to that of r, $B_LT$ is the dominant factor in the loop gain equation (Equation 3). For this reason, the terms "loop gain" and $B_LT$ will be used interchangeably.

This formulation of loop constants parallels the definitions used in analog loops. In analog implementations, the loop parameter bandwidth $B_L$ becomes the usual loop bandwidth. In digital implementations, $B_L$ can be regarded as loop bandwidth in its diverse uses if $B_LT << 0.1$. For large values of $B_LT$, however, $B_L$ underestimates loop noise bandwidth, but is more relevant in the calculation of dynamic effects.

To obtain a conventional third-order loop-filter, the usual double-sum term ($K_3\Sigma\Sigma\delta\phi$) could be added to Equation (2). Higher-order filters could be implemented in the DPLLs described below, but such options will not be analyzed herein.

A.4 Number-controlled Oscillator

Figure 4:
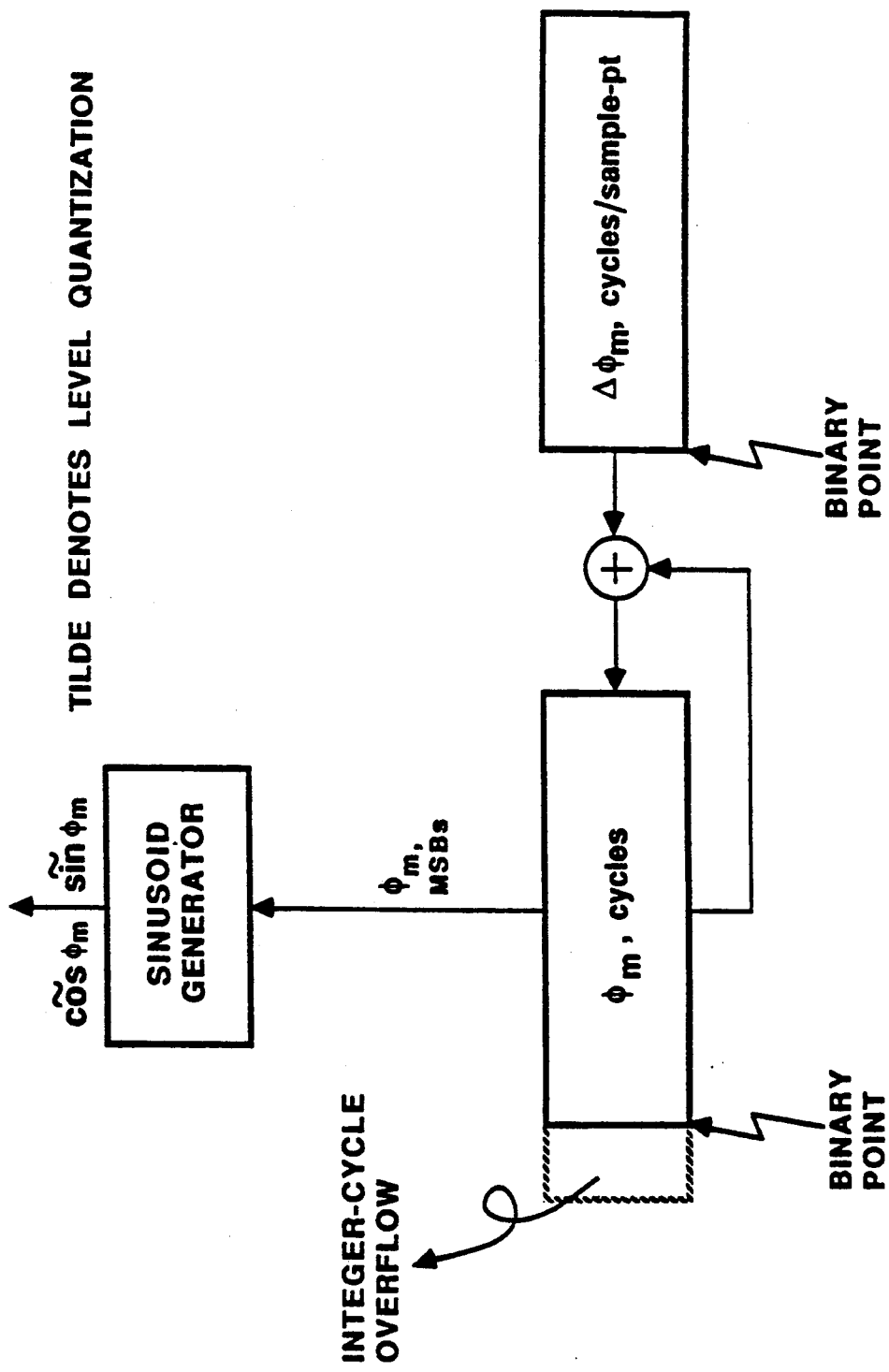
FIG. 4 is a schematic block diagram of a number-controlled oscillator.
Figure 5:
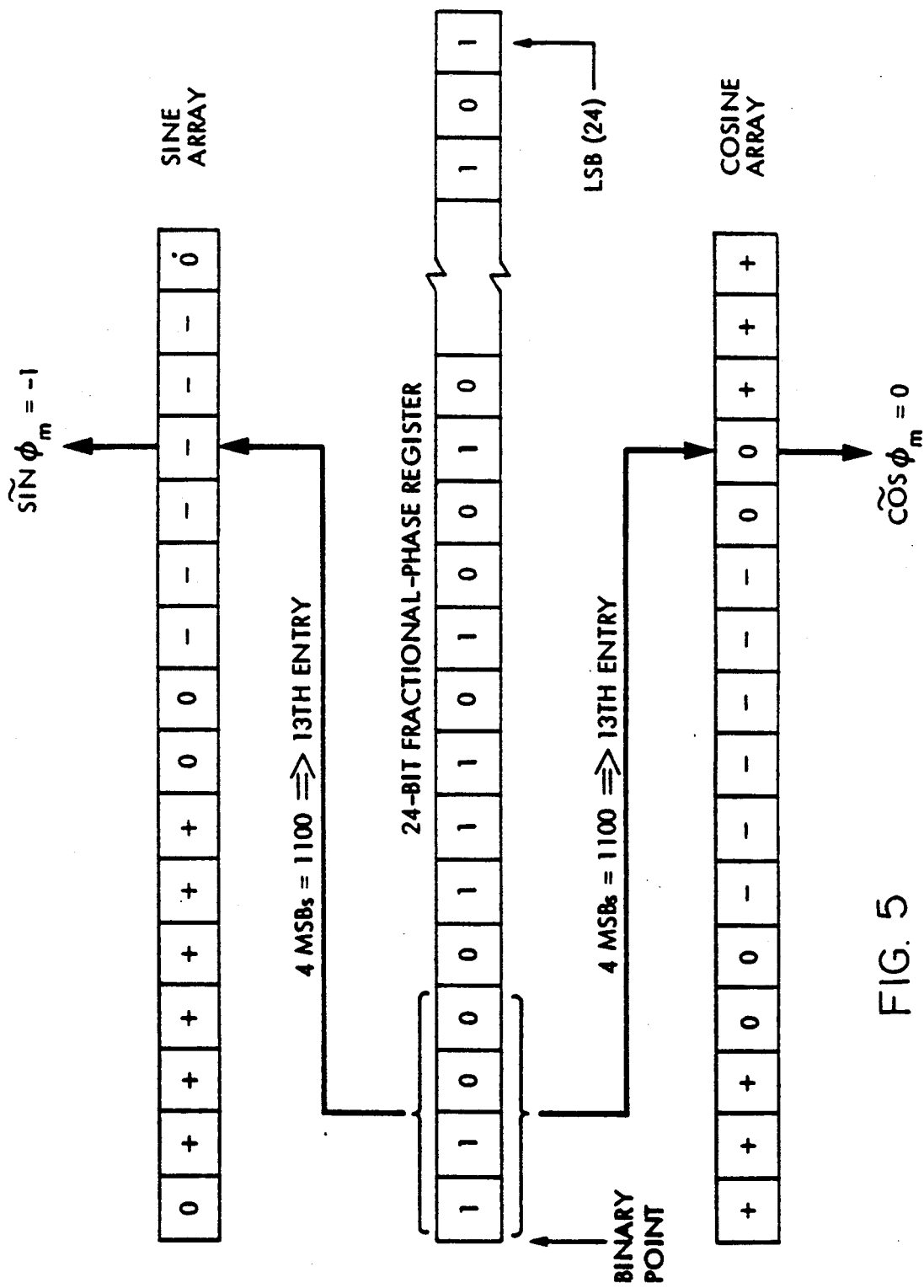
FIG. 5 is an example of the generation of counter-rotation sinusoids.

A schematic block diagram of an NCO is shown in FIG. 4. A phase register contains the most recent fractional-phase value in the form of an integer. (By dividing this integer by $2^{N_b}$, where $N_b$ is the number of bits in the register, one can obtain the fractional-phase in units of cycles.) A rate register contains the current phase rate in the form of an integer. (To obtain the phase rate in units of cycles/sample, one can divide this integer by $2^{N_b}$.) For each new sample point, the NCO increments the phase register with the rate register to obtain the next phase value. The most significant bits (MSBs) of the resulting fractional-phase are then used to drive a phasor generator consisting of a table-lookup or logic circuitry that generates two quantized sinusoids. The resulting phasor is multiplied by the current complex sample value to counter-rotate the signal. Phasor generation is illustrated in FIG. 5 for three-level sinusoids based on the 4 MSBs of a 24-bit fractional-phase register.

As indicated in FIG. 4, the NCO phase register only tracks fractional-phase since integer cycles have no effect on the table lookup. Integer cycles that appear as overflow when phase is advanced are discarded.

In the detailed design of an NCO, one must choose a value for the number of bits in the phase register and choose the number of levels for quantizing sinusoid amplitude. As indicated above, such choices are highly dependent on the application and need not be specified here. It will be assumed, however, that errors resulting from quantization and roundoff can be made sufficiently small to meet performance goals of the DPLL. For example, the effects of the harmonics caused by quantizing the sinusoids can be reduced to a negligible level by the filtering effect of the counter-rotation sum if the phase rate of the input tone is sufficiently high and is effectively incommensurate with the sample rate.

A.5 NCO Feedback

Two high-level decisions must be made concerning the NCO feedback: a) whether to update only rate in the NCO or both phase and rate; and b) how long to make the computation delay (the delay from the completion of a sum-interval to the time that the hardware inserts into the NCO the feedback derived from the output of that sum-interval.)

Figure 6A:
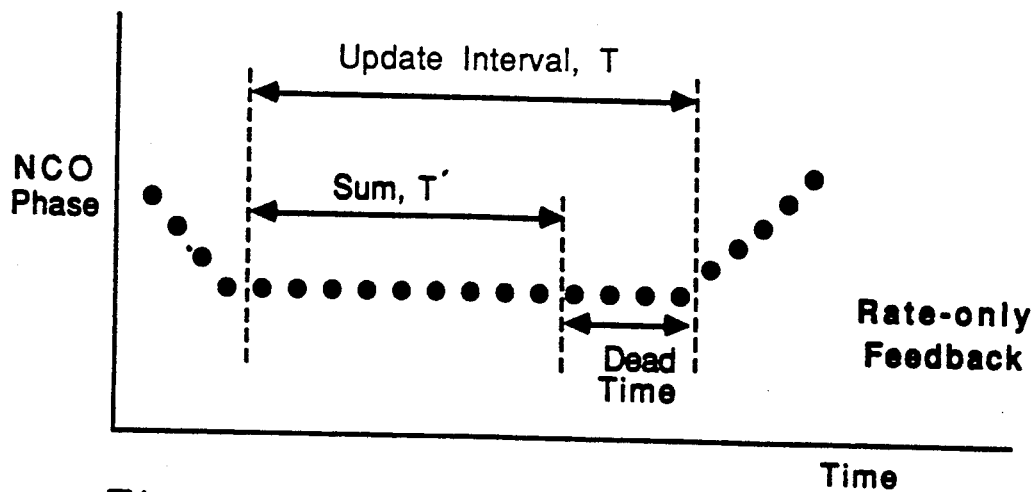
FIG. 6 is a schematic illustration of NCO phase and of loop intervals for rate-only feedback and for phase-and-rate feedback, respectively.
Figure 6B:
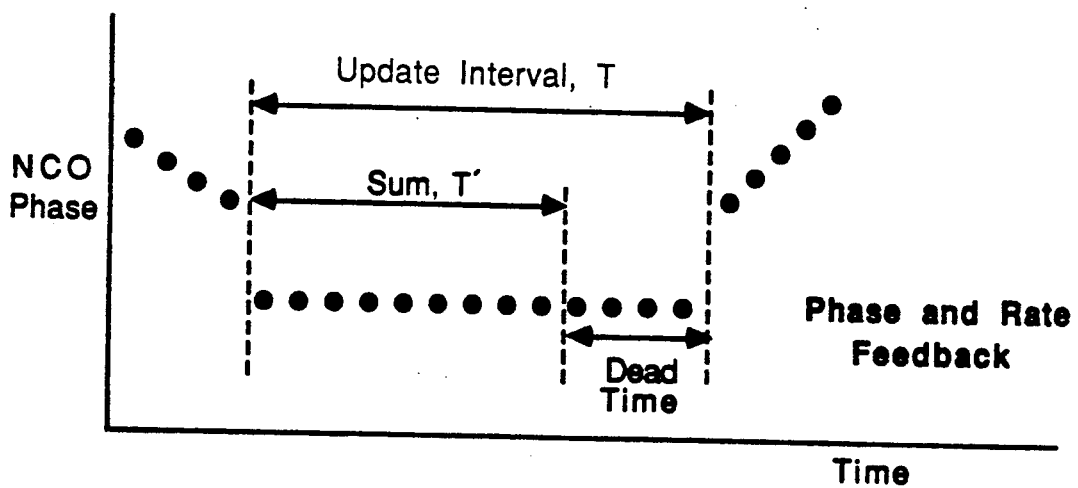

With regard to decision a), conventional DPLLs update only the NCO rate, while maintaining a "continuous" phase function. By updating both phase and rate, however, one can obtain substantially improve loop performance when a large loop gain (e.g., $B_L T > 0.1$) is used. To provide comparison of the two approaches, the DPLL designs analyzed below are based on rate-only feedback and phase-and-rate feedback, respectively. NCO phase behavior for these two options is schematically illustrated in FIG. 6.

With regard to decision b), better loop response will be obtained, in general, it the residual-phase from each sum-interval is utilized as quickly as possible. The impact of computation delay is strongly dependent on loop gain. If the application allows use of small values of $B_L T$ (e.g., 0.01), the adverse effects of computation delay, even when it is as large as an update interval, can be very small. If loop gain is high, a computation delay can substantially degrade loop performance.

In the analysis that follows, one of two assumptions will be made concerning computation delay. In the easiest implementation, it is assumed that a whole update interval is used to carry out feedback computations. This implementation, which has been extensively studied and used, will restrict loop gain to smaller values than the alternative implementation. In the alternative implementation, it is assumed that the hardware is fast enough to carry out feedback operations during a dead-time between sum-intervals, with a negligible loss of SNR due to the data lost during the dead-time. Because of the dead-time, the sum-interval, $T'$, will be slightly shorter than the update interval, $T$, as illustrated in FIG. 6.

The choice of phase extractor impacts the decision about the size of computation delay. As explained previously, a sine extractor can allow the use of much smaller update intervals than an arctangent extractor. When the update interval is smaller, larger values of loop bandwidth can be used while keeping $B_L T$ small. If $B_L T$ is small, the computation delay can be set equal to whole update interval without substantially compromising loop performance. This approach avoids the development of very fast dead-time hardware and suffers no loss of SNR due to lost data.

A.6 Output Phase

We now first explain computation of phase output by the loop once every sum-interval and then summarize the step that averages the loop-output to obtain a lower rate and lower noise.

A.6a Loop-Output

Because the tracking processor can control exactly the phase generated by the NCO, model-phase applied by the NCO at the center of a sum-interval can be easily calculated by the tracking processor. Two options for loop-output will be considered: model-phase at interval center and total measured phase at interval center. Total measured-phase is computed as sum of model-phase and residual-phase. Conventional DPLLs generate model-phase (i.e. "NCO-phase") and neglect the important information contained in the residual-phase. Because residual-phase is a measure of the tracking error across a sum-interval, it should be utilized unless there are other overriding considerations. An example of the advantage of this procedure is provided by the classical steady-state phase error that is suffered when a second-order loop tracks a quadratic phase function (e.g., an acceleration). By adding residual-phase to model-phase, the steady-state phase error can be corrected.

When model-phase and residual-phase are combined, therefore, tracking error can be essentially eliminated in the loop-output, leaving only system noise to corrupt the output. (If the DPLL is properly designed and implemented, quantization and roundoff effects can be reduced to a negligible level.)

One potential disadvantage of this approach is the increase in noise bandwidth of the output observable. The SSNB of model-phase is loop noise bandwidth, $B_L^N$, whereas the noise bandwidth of the total-phase observable is sum bandwidth $1/(2T')$. (When model-phase and residual-phase are added, model-phase, including its noise, disappears, because residual-phase is equal to total-phase minus model-phase. Thus, total-phase noise bandwidth is then equal to sum bandwidth.) Since $2B_L^N T'$ can be small (e.g., $<0.2$), the SSNB of total-phase can greatly exceed the SSNB of model-phase.

For applications in which SNR is low, tracking error is small, and each phase value output by the loop must have a small total error for some reason, loop parameter bandwidth can be set to a small value (e.g., $B_L T < 0.1$) and model-phase could be used as loop-output. In high-accuracy applications in which many loop-output values are averaged to obtain output phase, total-phase should be output by the loop.

Another feature of importance for the loop-output points is the degree of noise correlation between output points. If total-phase is extracted, there is no correlation between the noise on the phase values extracted for different update intervals, because noise arising during one sum-interval is uncorrelated with the noise from any other sum-interval.

If model-phase is extracted, however, the noise on loop-output from adjacent update intervals can be highly correlated. In this case, the extent of correlation is such that, in an interval $T_a$ containing many update intervals, there are effectively $2B_L^N T_a$ independent values of phase with respect to noise. This result for independent values has been verified statistically to good approximation with simulation software, for both small and large loop gains. The decorrelation interval, which will be defined as the effective interval between statistically independent points, is equal to $1/(2B_L^N)$.

A.6b Compressing Loop-Output

In most applications, the user will want a phase value less frequently than every sum-interval. For example, the loop-output rate might be 1000 Hz, while the user wants one phase value per second. Conventional loops often "compress" the output rate by extracting phase produced for every nth sum-interval (e.g., by "strobing" the NCO phase) while ignoring the other values. This approach does not use all of the information produced by the loop and unnecessarily sets the compressed-phase bandwidth equal to the loop bandwidth. In the compression scheme described below, it is possible to set the output rate and bandwidth of compressed-phase independently of loop parameters.

This alternate approach, which is most appropriate when the loop-output is total-phase, implements an algorithm to "average" loop-output phase. Possible averaging approaches would include a least-squares fit of polynomial to the phase values from all update-intervals in a specified averaging interval (e.g., 1000 values over a one-second interval). The time-tag for estimated phase would be placed at the center of the averaging interval and could be selected to fall on the integer-second. In many applications, the averaging algorithm can be tailored to expected phase dynamics to minimize "modeling" error. For example, the order of a polynomial could be increased to the level necessary to handle expected phase dynamics.

As mentioned above, when an "averaging" operation is applied to compress many loop-output points to one point, the SSNB noise bandwidth of the averaged phase will be of the order of $1/(2T_a)$, where $T_a$ is the averaging interval. This same noise bandwidth for the compressed data would result for either of the two choices for loop-output phase. (It is assumed that $2B_L^N T_a >> 1$ so that the averaging "filter" is dominant). Thus, if such averaging is applied, total-phase is preferable to model-phase, because the same system-noise error is ultimately obtained and total-phase is more accurate with regard to tracking error.

A.7 Real-Time Clock

Time for the loop is kept by a real-time Clock driven by the sample clock. The real-time clock consists of two integer registers, one containing integer-seconds and the other fractional-seconds in units of input sample points. The fractional-second register is incremented by one for each sample (i.e. for each rising edge of the sample clock). When the number contained in the fractional-second register reaches the number of samples per second (i.e. $f_s$), the fractional-second register is set to zero and the integer-second register is incremented by one. Circuitry is provided to initialize the real-time clock by synchronizing with an external 1 pps.

A.8 Tracking-Processor Control Functions

The tracking processor controls the start and stop times for the counter-rotation sum. As indicated in FIG. 1, the start-time of the sums is controlled by a start-time variable, $t_s$, that is maintained by the TP. In the example design, the $t_s$ variable, in the same way as the real-time clock, is represented by two integer registers, one for integer-seconds and one for fractional-seconds. The fractional-second register is in units of input sample points. For every update interval, the TP increments the start-time variable by the length of the update interval, in units of samples per update interval, or $f_s T$, where $f_s$ is the sample rate. When the fractional-second register reaches $f_s$, it is reset to zero and the integer-second register is incremented by one. In anticipation of the next sum-interval, the TP computes the start-time for the next interval in parallel with the CP operations for the current sum and passes the two resulting register values to the CP.

In the CP, circuitry compares the two start-time registers with the corresponding real-time clock registers for every sample-clock cycle. When the real-time-clock registers have advanced to equal the start-time registers, enabling logic produces a logic signal that activates the accumulators. The sum is terminated when the number of summed samples reaches a count of $f_s T'$, where $T'$ is the sum-interval. Sum-interval length (i.e. the integer $f_s T'$) can be set by the TP.

Since both start and stop times are exactly controlled (to the exact sample point) by the TP, the TP can accurately compute the time-tag (i.e. the interval center time) for each sum-interval. Accurate time-tags are an important goal in DPLL designs. For example, if the phase rate of the tracked tone is 10 KHz, the time-tag must be accurate to the 100-nsec level if the desired phase accuracy is a millicycle.

In some applications, it would be useful for the tracking processor to vary loop gain during a track. Based on currently observed SNR of the loop, the tracking processor could adjust loop gain to the maximum value consistent with that SNR. Such a procedure could be carried out without losing cycle count or perturbing lock. In this manner, loop dynamic response would be set to the best level allowed by current SNR. Similarly, for small SNRs, the phase extractor could be switched from an arctangent to a sine operation.

B. DPLL with Rate-only Feedback

B.1 Functional Description

Figure 7:
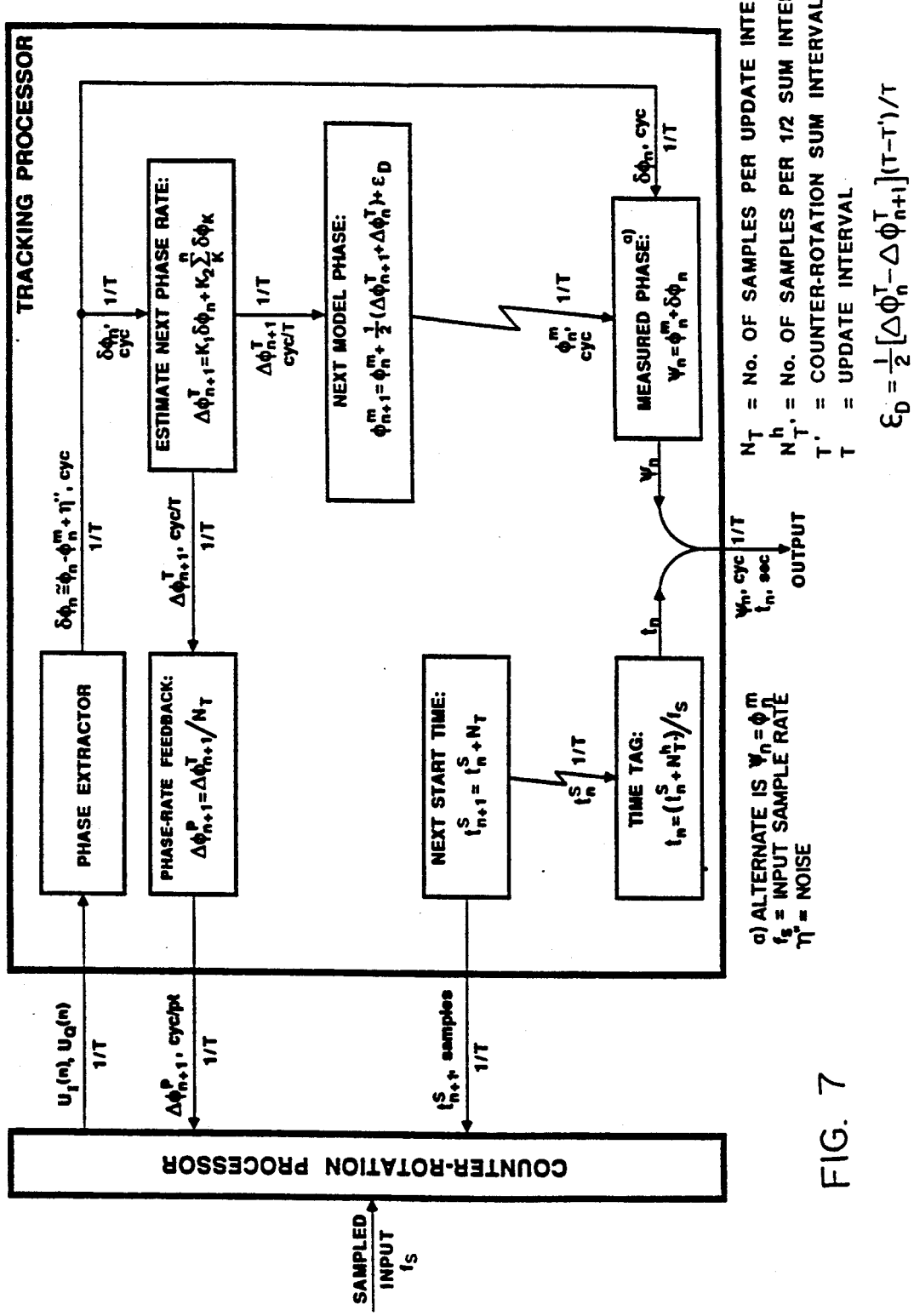
FIG. 7 is a block diagram of a tracking processor used as an example for a digital phase-lock loop with rate feedback.

A detailed functional description of tracking-processor operations is shown in FIG. 7 for a DPLL with rate-only feedback. CP operations are not shown because they are identical to those shown in FIGS. 1 and 4. In each subsection, the TP is first described for a design with very small computation delay and then differences are noted for a design with a computation delay of one update interval.

The CP supplies the TP with the complex sum produced by CP operations for the nth sum-interval. The TP extracts the nth residual-phase from this sum with an arctangent or sine extractor. Based on this residual-phase and previous residual-phase values, the loop-filter estimates the (n+1)th value for phase rate by means of Equation (2), in units of cycles per update interval T. This phase rate is then divided by the number of sample points per update interval to obtain, for the (n+1)th interval, phase-rate feedback in units of cycle per sample. To obtain an integer appropriate for the NCO register, the resulting phase-rate value is multiplied by $2^{N_b}$ and rounded to the nearest integer, where $N_b$ is the number of bits in the NCO rate register. The resulting integer is then loaded into the NCO rate register to set rate for the (n+1)th interval. Updating of the rate register is carried out "between samples" so that no phase increments are missed, thereby generating a "continuous" phase function, as schematically illustrated in FIG. 6. (If a few phase increments must be skipped and the number is exactly known, the effect can be accounted for in TP modeling.)

As explained above, the start-time, which is incremented by $f_s T$ each update interval, controls the activation of the accumulators. Completion of a sum-interval is signaled when the number of summed samples reaches $f_s T'$, where $f_s$ is the sample rate and $T'$ is the sum-interval.

NCO-update time and sum-start time for each interval are controlled so that a sum starts on the first point that uses the new update value. The sum stop time is set so that each sum stops a number of samples short of a full update interval, T. As discussed above, this short dead-time interval without summing is sacrificed so that the feedback calculations outlined in the preceding paragraph can be carried out using the residual-phase of the interval just completed. During the dead-time, the NCO phase advancer continues to increment phase for each new sample point on the basis of the old rate, even though the CP sum for that interval has been terminated (see FIG. 6).

As discussed above, for accuracy in dynamic applications, measured phase for the nth interval can be computed as the sum of the nth model-phase and the nth residual-phase. One measured phase value is output every update interval, with a time-tag at sum-interval center.

When the computation delay is equal to one update interval, the above description changes in two places. First, the loop-filter computation of phase rate Equation (2) includes residual phase values up to the (n−1)th rather than to the nth. Second, the sum-interval length can be set equal to the update interval. (It will be assumed that updating of the NCO can be carried out "between samples" so that there is no need for a deadtime.)

B.2 Model-Phase

Because the TP controls the NCO, the TP can calculate exactly, for any time point, the phase computed in the NCO phase register. The difference equation for computing model-phase at the center of the sum-interval n+1 from model-phase at the center of interval n is given by $$\phi_{n+1}{}^m = \phi_n{}^m + \tfrac{1}{2}(\Delta\phi_{n+1}{}^T + \Delta\phi_n{}^T) + \epsilon_D \qquad (5)$$

where $\Delta\phi_n{}^T$ is the nth phase change between intervals given by Equation (2). To exactly calculate the model-phase computed by the NCO, the values of phase change used in Equation (5) should be the rounded values corresponding to the actual integers used in the NCO rate register. The second and third terms on the right of Equation (5) represent the phase buildup contributed by the NCO between interval centers, with half the buildup coming from interval n and half from interval n+1. The last term corrects for the dead-time and is given by $$\epsilon_D = \tfrac{1}{2}(\Delta\phi_n{}^T - \Delta\phi_{n+1}^T)\left(\frac{T-T'}{T}\right) \qquad (6)$$

This small correction is important in model computations since it can be cumulative. (When the computation delay is one update interval and the dead-time is zero, this correction is zero.)

As previously mentioned, quantization errors introduced in the generation of the counter-rotation phasors will be averaged to negligible levels, given proper design. For this reason, the value in the NCO phase register becomes the effective phase applied by the NCO, as assumed herein.

B.3 Transfer-Function

We now derive and analyze the closed-loop transfer-function for a rate-only DPLL with a negligible computation delay. In addition, performance for a rate-only DPLL with a computation delay of one update interval is presented in terms of loop noise bandwidth and stability limits.

A recursive difference equation relating input phase, $\phi_n$, with model-phase, $\phi_n{}^m$, is obtained by substituting Equation (2) in Equation (5), with residual-phase, $\delta\phi_n$, set equal to input phase minus model-phase. A z transform can be applied to this difference equation to obtain the closed-loop transfer-function that maps input phase to model-phase. As usual, a linearized model of the loop will be assumed. In computing the transfer-function, the small correction term, $\xi D$, can be ignored if the deadtime is sufficiently small. If the correction term is ignored, the transfer-function for a rate-only DPLL with negligible computation delay becomes $$H(z) = \frac{K_1(z^2 - 1) + K_2 z(z + 1)}{2z(z - 1)^2 + K_1(z^2 - 1) + K_2 z(z + 1)} \qquad (7)$$

A treatment of transfer-functions for rate-only DPLLs can be found in "Design and Performance of Sampled Data Loops for Subcarrier and Carrier Tracking" by Acquirre et al.

Figure 8:
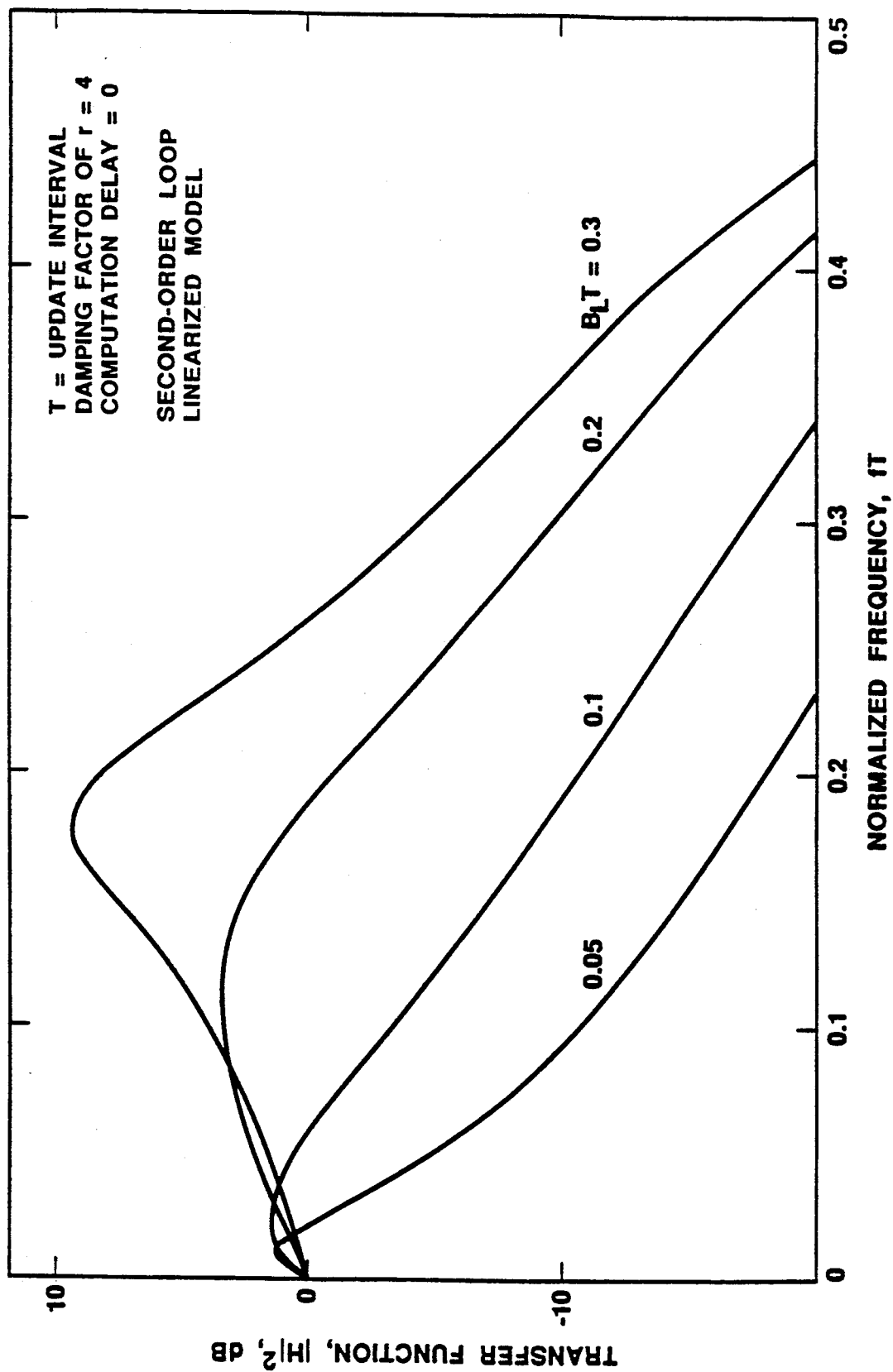
FIG. 8 is a graphical illustration of the frequency response of a digital phase-lock loop with rate-only feedback.

If the transfer-function is evaluated along the unit circle, one obtains the frequency response of the loop. FIG. 8 shows the frequency response for several values of normalized loop parameter bandwidth, $B_L T$, with r set equal to 4. The bandpass shapes for r=2 are similar and are not shown.

The frequency response curves can be interpreted as follows. When the loop is in perfect lock, zero frequency in FIG. 8 corresponds to the tone frequency. Note that the tracked tone is subjected to a loop power gain of 1.0. A sinusoid entering the loop-filter at frequency f relative to the tracked tone will experience the power gain found at frequency f in the plot, provided |f| is less than 1/(2T). Note that, for high-gain loops, some frequency components can be greatly amplified relative to the tracked tone. If the sinusoid has a frequency outside the filter range of −1(2T) to 1/(2T), it must be aliased into the filter range, modulo 1/T.

Before a given sinusoid reaches the loop-filter, it experiences the filtering effect of the CP sum. Thus, to obtain the total gain at a given frequency, one first applies the amplitude decrease caused by the sum filter (sinx/x in FIG. 2), before down-aliasing, and then down-aliases into the loop-filter passband to apply the amplitude change caused by the loop response in FIG. 8. Note that the sum filter can substantially decrease sinusoid amplitude (especially an out-of-band) before the sinusoid reaches the loop-filter.

As explained above and as illustrated in FIG. 2, the noise spectrum can be viewed in a simplified way after these operations have been applied to all noise components. When the sum filter and down-aliasing are applied to all of the components of input noise with a flat power spectrum, the effective composite noise spectrum entering the loop-filter within the sum sampling bandpass is a perfectly flat rectangular spectrum between $-1/(2T)$ and $+1/(2T)$.

Loop noise bandwidth is the bandwidth of a rectangular filter that would generate the same total output noise power as the loop-filter, when that rectangular filter is given the same gain (i.e., 1.0) as the loop-filter at zero frequency. Loop noise bandwidth is easily computed from the frequency response and is plotted in FIG. 9 for r=2 and r=4 as a function of $B_LT$. In this computation, it is implicitly assumed that the effective noise spectrum entering the loop-filter, is flat across the sampling bandwidth, as explained previously.

Figure 9:
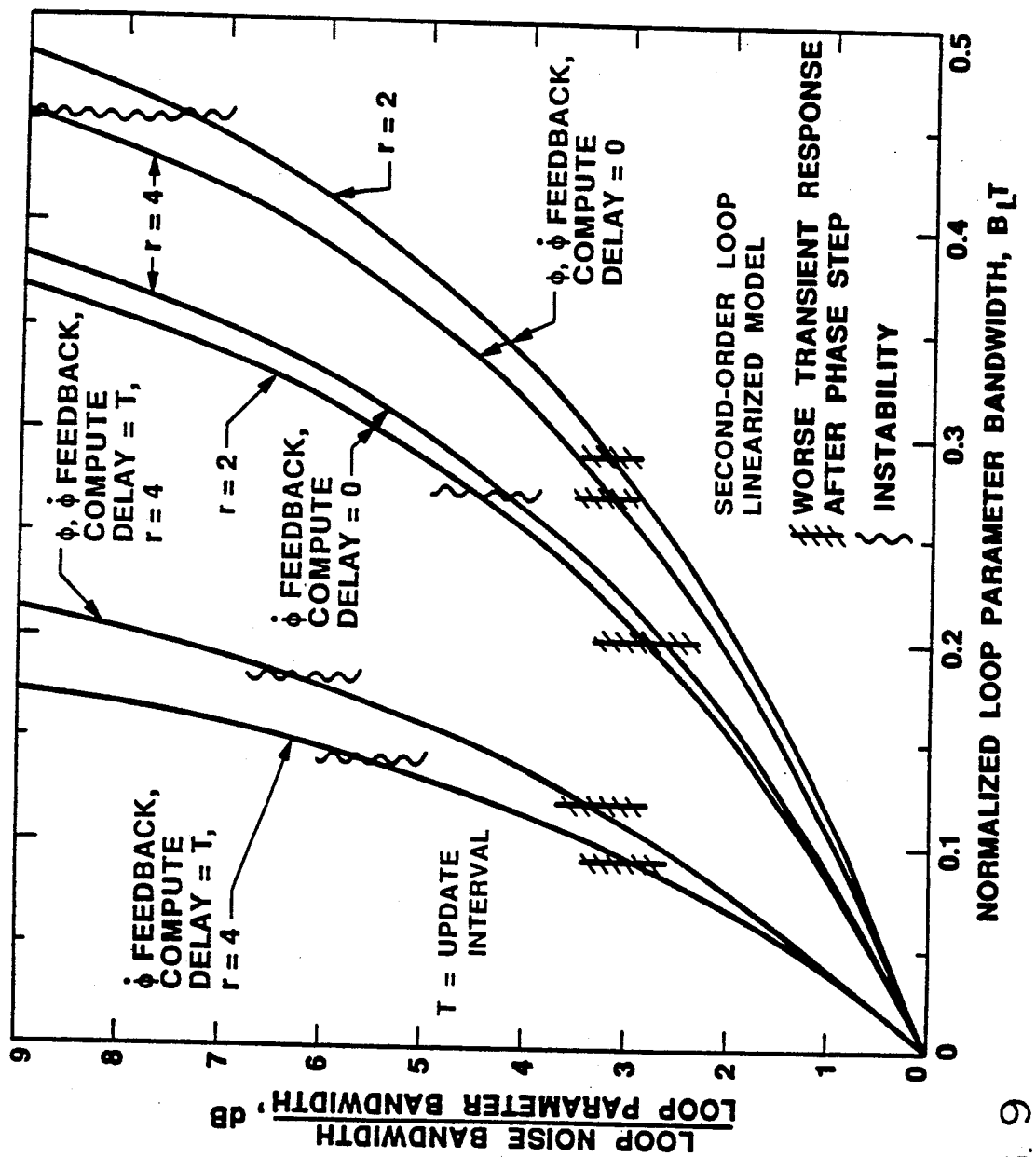
FIG. 9 is a graphical illustration of loop noise bandwidth vs. loop parameter bandwidth.

In FIG. 9, the curves of loop noise bandwidth have been marked to indicate where loop transient response begins to deteriorate as $B_LT$ increases. The criteria behind these limits are explained hereinafter. For comparison, FIG. 9 also plots loop noise bandwidths for a rate-only DPLL with a computation delay of one update interval, T. As one would expect, the loop noise bandwidths for small $B_LT$ (i.e., less than <0.01) are nearly equal. When $B_LT=0.1$, the loop noise bandwidth for the rate-only DPLL with no computation delay delay is about 2 dB smaller than for the rate-only DPLL with a computation delay of one update interval.

Figure 10:
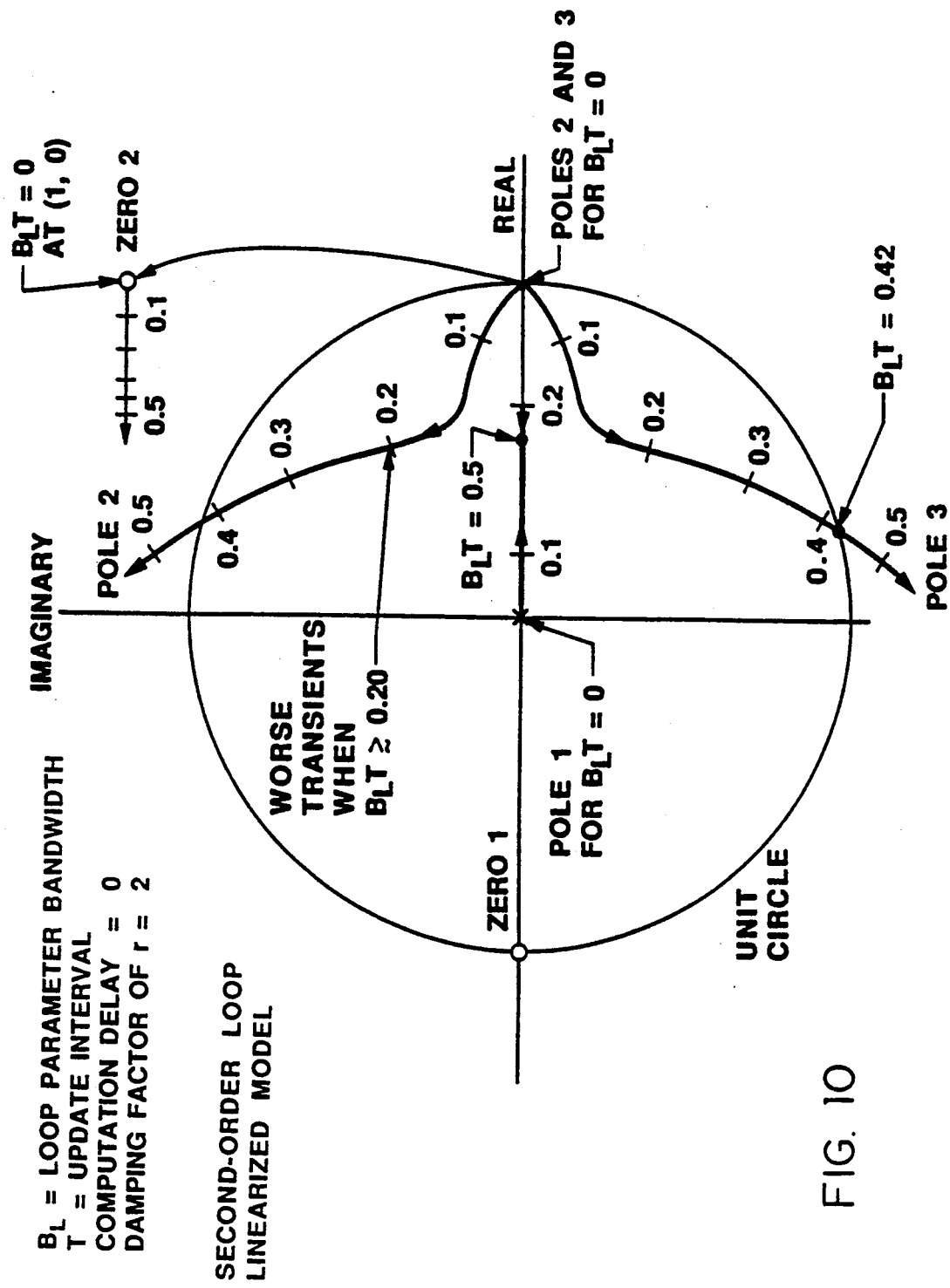
FIG. 10 is a graphical illustration of the root-loci for a first case of a digital phase-lock loop with rate-only feedback.
Figure 11:
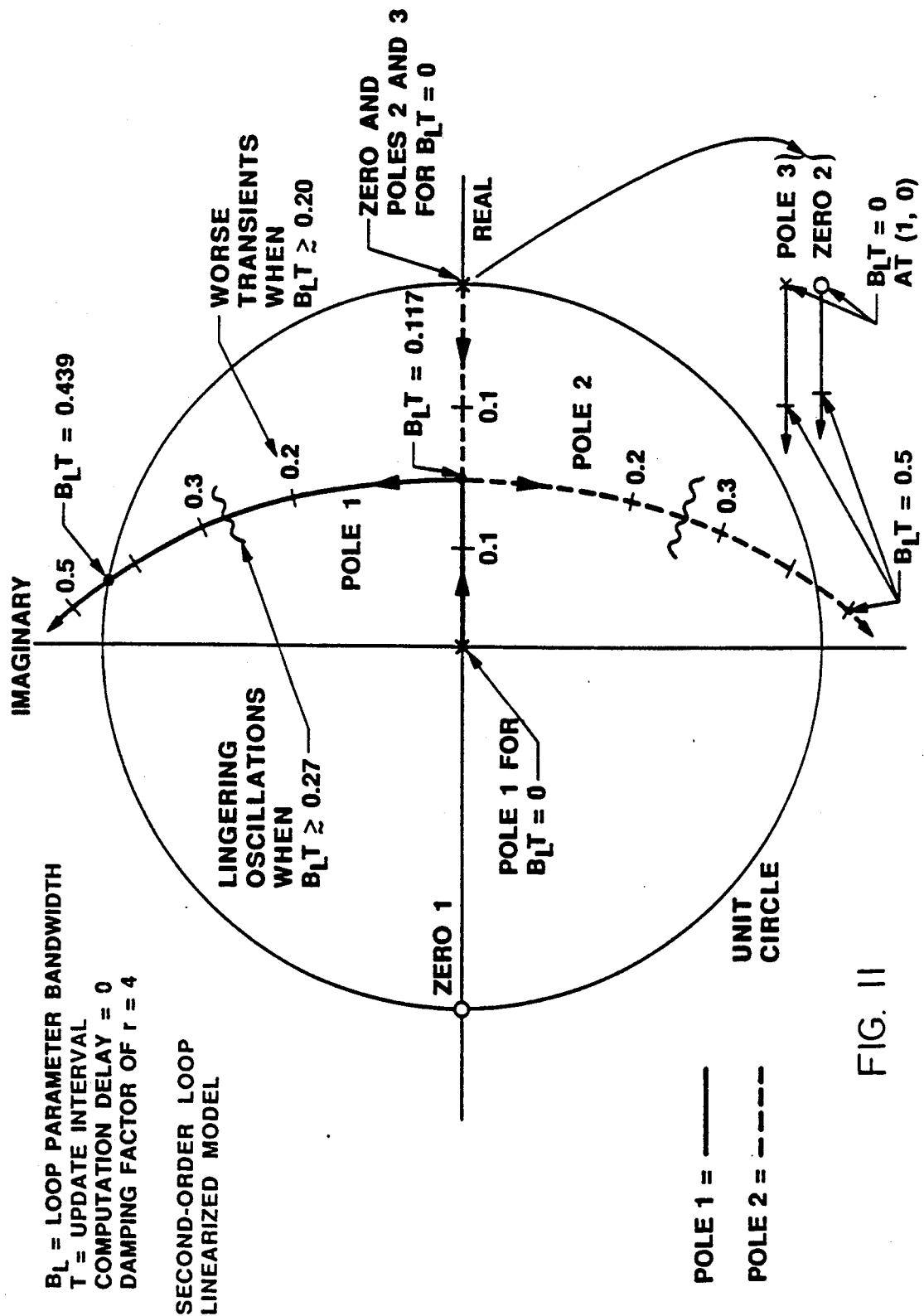
FIG. 11 is a graphical illustration of the root-loci for a second case of a digital phase-lock loop with rate-only feedback.

The paths of the poles of the transfer-function for a rate-only DPLL with no computation delay are shown in FIGS. 10 and 11 for r=2 and r=4, respectively, as a function of $B_LT$. (Pole paths are usually plotted versus a factor corresponding to conventional loop gain in order to assess the effect of unwanted variations in tone amplitude. When an amplitude-insensitive phase extractor is used, it is more meaningful to vary the loop gain defined above. Such a plot is useful in selecting a loop gain during loop design.) The poles cross the unit circle at $B_LT=0.420$ and $B_LT=0.439$ for r=2 and r=4, respectively. Note that pole movement toward the unit circle is manifested in the frequency response in FIG. 8 by the bulge in gain at fT=0.18 when $B_LT=0.3$. This bulge, which approaches infinity as $B_LT$ approaches 0.439 (the unit circle crossing for r=4), is what causes loop noise bandwidth to increase dramatically when $B_LT>0.25$. (The value of fT=0.18 corresponds to a point on the unit circle that is rotated 0.18 cycle away from the positive x axis.)

B.4 Dynamic Tracking Errors

When phase is a nonlinear function of time, a second-order loop will exhibit tracking errors due to dynamics. For the DPLL design presented above, we now discuss the steady-state response to quadratic phase variation and the transient response to a step in phase and to a step in frequency. Results are presented in detail for a DPLL with negligible computation delay and are summarized for a DPLL with a computation delay of one update interval.

B.4a Transient Response

Software has been written to simulate the transient response of a rate-only DPLL to input phase characterized by either a phase step or by a frequency step. When $B_LT$ is set to small values, the loop response predicted by this simulation software closely approximates the response of an analog loop with the same bandwidth and damping, as expected.

Figure 12:
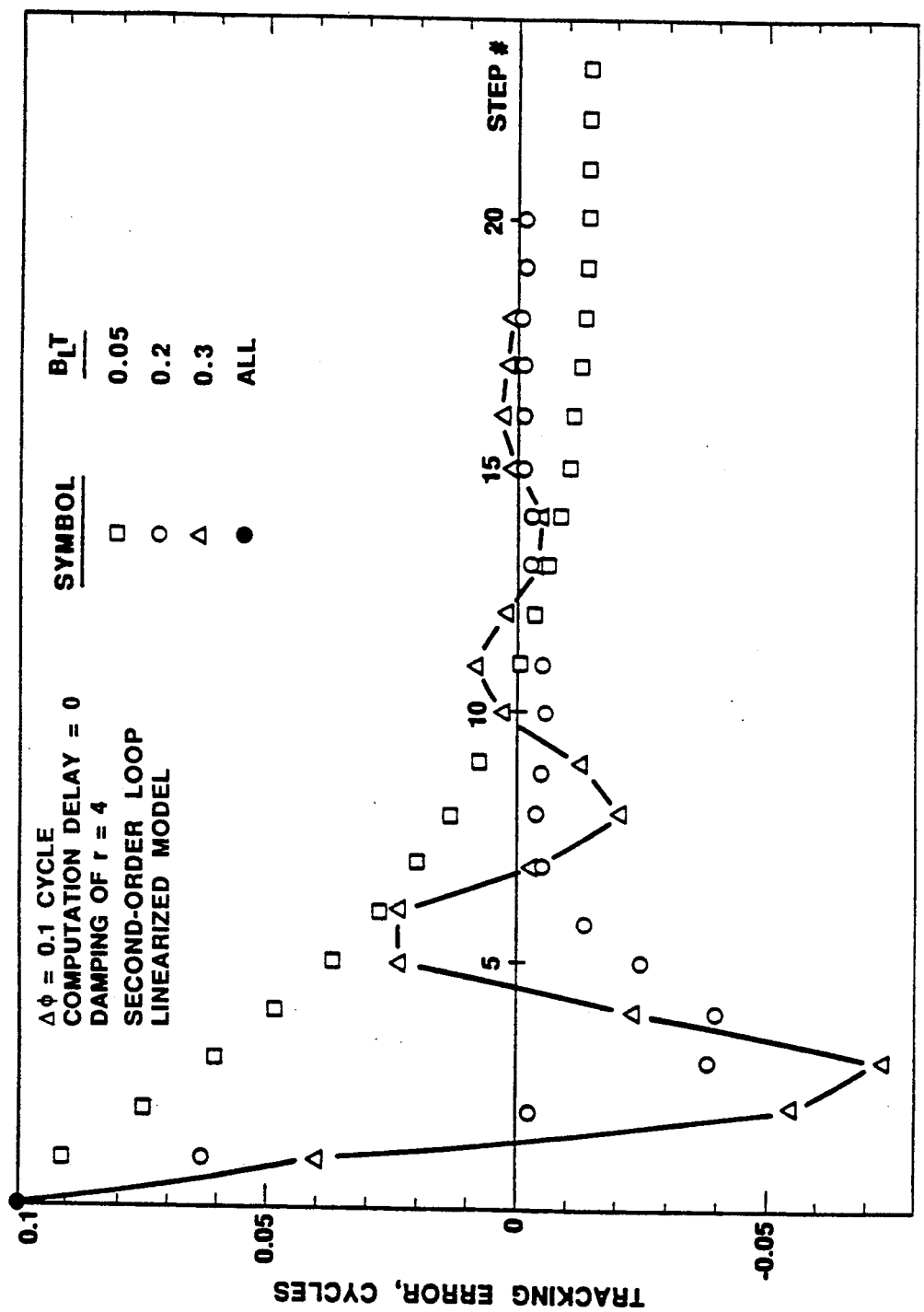
FIG. 12 is a graphical illustration of the transient response after a phase step for a digital phase-lock with rate-only feedback.

Transient response following a phase-step input to a rate-only DPLL with a negligible computation delay is presented in FIG. 12 for several values of $B_LT$ with a damping factor of r=4. For smaller values of $B_LT$, transient errors decrease as $B_LT$ increases but then start to increase for larger values of $B_LT$. In FIG. 12, note the increase in transient errors and the increased oscillations when $B_LT=0.3$. As a measure of transient response, the RSS transient error following a phase step can be calculated as a function of $B_LT$. Based on this standard, transient errors following a phase step decrease as $B_LT$ increases until $B_LT$ reaches about 0.20 and then begin to increase. Instability, which will be defined as lingering oscillations in transient response when r=4, appears when $B_LT>0.27$.

The corresponding transient response curves for a rate-only DPLL with a computation delay of one update interval are not presented, but the limits on $B_LT$ derived from consideration of dynamic response are shown in FIG. 9.

These results for transient response can help establish an upper limit for loop gain. The upper limit to loop gain can be based on one of three criteria, as summarized in Table III. The least conservative is the value of $B_LT$ at which a pole crosses the unit circle. This upper limit is sometimes used as a crude estimate, but is too loose because of excessive loop noise bandwidth and oscillations as the limit is approached. For the rate-only loops treated in FIGS. 10 and 11, this limit becomes $B_LT=0.42$ and 0.439, respectively. A more conservative and realistic limit can be based on the onset of lingering oscillations following a phase step when r=4. For the rate-only loop treated in FIG. 11, this upper limit is $B_LT=0.27$. The most conservative of the three criteria is based on RSS transient response following a phase step, as discussed above. For the rate-only DPLL in FIG. 11, this criterion would restrict $B_LT$ to values less than about 0.20.

TABLE III

| Upper Limits For $B_LT$ In Digital Phase-Lock Loops* | | | | |
|---|---|---|---|---|
| | r = 2 | | r = 4 | |
| Criterion | Update φ | Update φ,φ̇ | Update φ | Update φ,φ̇ |
| Pole Breakout | 0.420 | 0.549 | 0.439 | 0.518 |

TABLE III-continued

| Upper Limits For $B_LT$ In Digital Phase-Lock Loops* | | | | |
|---|---|---|---|---|
| | r = 2 | | r = 4 | |
| Criterion | Update $\phi$ | Update $\phi,\dot\phi$ | Update $\phi$ | Update $\phi,\dot\phi$ |
| Lingering Oscillations** | — | — | 0.27 | 0.45 |
| RSS Transients** | 0.2 | 0.29 | 0.2 | 0.27 |

*Second-order loops, negligible computation delay
**Following phase step

Figure 13:
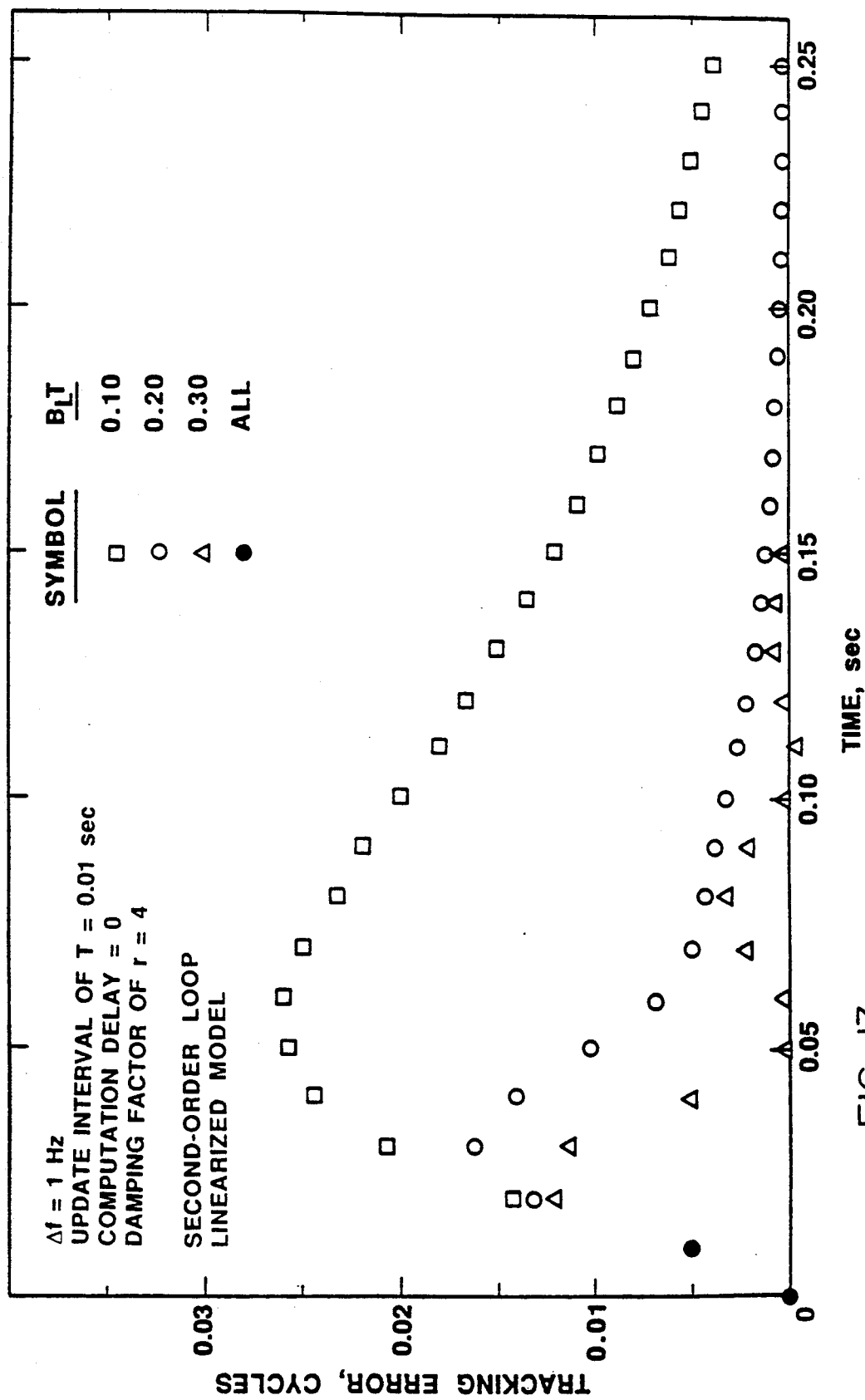
FIG. 13 is a graphical illustration of the transient response after phase-rate step for a digital phase-lock loop with rate-only feedback.

Transient response of a rate-only DPLL with a negligible computation delay following a rate-step input is shown in FIG. 13 for r=4 and for several values of normalized loop parameter bandwidth, $B_LT$. RSS transient response continues to improve well past the maximum value of $B_LT=0.20$ suggested by the more stringent phase-step criterion. Note, however, that transient oscillations are present when $B_LT=0.30$. For small values of $B_LT$, an approximate formula can be used to estimate the maximum rate step that a loop can handle. In the maximum allowed tracking error is 0.5 cycles, the maximum allowed rate step is approximately given by $2B_L$. When allowance is made for noise, or the limited range of a sine extractor, the maximum rate step will be less.

B.4b Steady-state Response

When phase is a quadratic function of time, the tracking error for a second-order loop will approach a steady-state value which is given by $$\phi_{ss} = \frac{\ddot\phi T^2}{K_2} \quad (8)$$

where $\ddot\phi$ is the phase-rate rate in cycles/sec and where $K_2$ is given by Equation (4). A useful rule of thumb can be obtained from Equation (8) by determining the maximum phase-rate rate that can be tolerated when r=2 and when the maximum allowed tracking error is 0.5 cycle. In this case, Equations (3, 4 and 8) yield $$\ddot\phi_{max} = \frac{1}{2} \frac{K_2}{T^2} = 1.8 B_L^2 \quad (9)$$

Thus, the maximum phase-rate rate is approximately equal to about twice the square of the loop parameter bandwidth, under the stated conditions. In practice in most applications, the maximum will be considerably less than this upper limit after consideration of the factors mentioned above.

Because steady-state response is independent of computation delay, the same results apply for a computation delay of one update interval.

C. A DPLL with Phase and Rate Feedback

C.1 Functional Description

Figure 14:
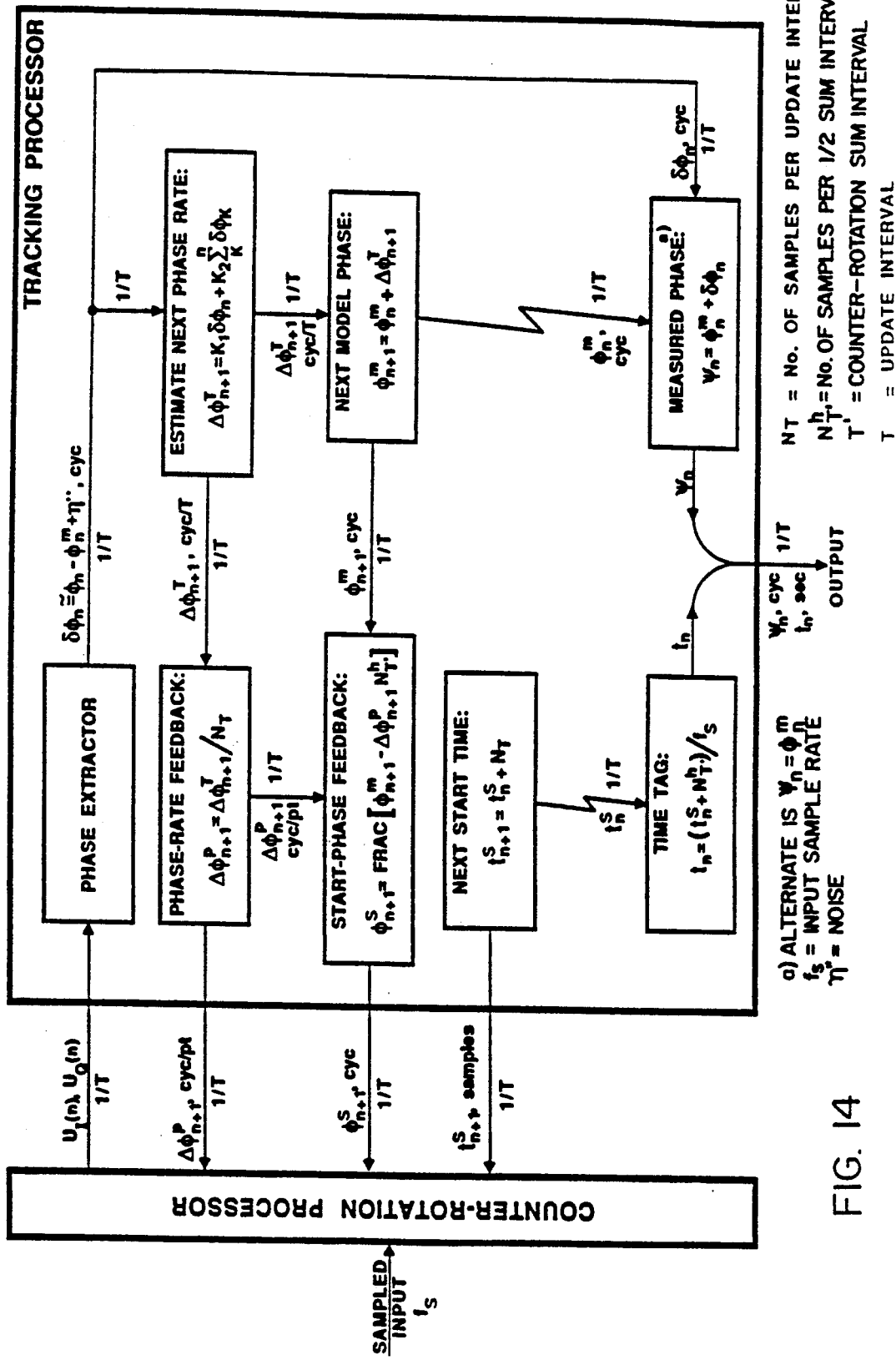
FIG. 14 is a block diagram of an exemplary tracking processor for a digital phase-lock loop with phase and rate feedback.

A detailed functional description of the tracking processor for a DPLL with rate and phase feedback and with a small computation delay is shown FIG. 14. The CP is identical to FIGS. 1 and 4 and is not shown. The TP is first described for a design with very small computation delay and then differences are noted for a design with a computation delay of one update interval.

The CP supplies the TP with the complex sum produced by CP operations for the nth sum-interval. The TP extracts the nth residual-phase, estimates the (n+1)th phase rate and computes the (n+1)th phase-rate feedback, as described for the rate-only DPLL.

Phase computation consists of the two steps shown in FIG. 14. First, model-phase, at the center of the sum-interval is computed as described below. Based on the phase-rate feedback for the (n+1)th interval, this center-interval value is then shifted by a half sum-interval to obtain feedback phase at the start of the (n+1)th interval. This shift must be based on half the slightly smaller sum-interval, rather than the update interval. Furthermore, even though FIG. 14 does not show it, the phase rate used in this computation should be the effective rate after the rounding required in the conversion to an integer. By using the rounded rate, round-off error buildup in the NCO across a sum-interval can be reduced to a negligible level.) The fractional part of the resulting start phase is then extracted, converted to an integer in the same fashion as phase-rate and inserted in the appropriate NCO register.

When both phase and rate are updated, NCO phase will usually be discontinuous at the update point, as schematically illustrated in FIG. 6. Sum-interval start-time and sum length are computed and controlled as outlined for the rate-only DPLL. As discussed above, for accuracy in dynamic applications, measured phase for the nth interval can be computed as the sum of the nth model-phase and the nth residual-phase. One measured-phase value is output every update interval, with a time-tag at sum-interval center.

When the computation delay is one update interval, the TP description changes in the same two places described above for a rate-only DPLL.

C.2 Model-Phase

As with the rate-only DPLL, the TP can precisely control the NCO. As illustrated in FIG. 14, however, the present invention first calculates the phase to be obtained by the NCO and then generates the feedback that will cause the NCO to attain that phase. In contrast, as shown in FIG. 7, a conventional DPLL first calculates the rate feedback to be used by the NCO and later reads or models how the phase of the NCO has reacted to said rate feedback. The TP pre-calculates the model-phase to be obtained in the NCO phase register at the center of each sum-interval. In the phase/rate DPLL, the difference equation for computing model-phase at the center of the (n+1)th sum-interval from model-phase at the center of the nth interval is given by $$\phi_{n+1}{}^m = \phi_n{}^m + \Delta\phi_{n+1}{}^T \quad (10)$$

where $\Delta\phi_{N+1}{}^T$ is the (n+1)th phase change, computed according to Equation (2). (For the phase/rate DPLL implementation shown in FIG. 14, the phase change used in Equation (10) is exactly the value predicted by Equation (2), and not the rounded value, as required in Equation (5). Rounding error in computing the integer for the NCO rate register can affect amplitude but not the composite phase for a sum-interval. On the other hand, rounding error in computing the integer for the NCO phase register does affect composite phase. If desired, this rounding can be accounted for, but it is generally a very small effect., e.g., $1\mu$ cycle for a 20-bit NCO phase register.) In comparing Equations (5 and 10), note that, when both phase and rate are updated, model-phase can receive the full benefit of the most recent estimate of phase-rate, in contrast to the rate-only DPLL. Because phase is updated each interval, no dead-time correction is necessary in the calculation of model-phase.

C.3 Transfer-Function

Figure 15:
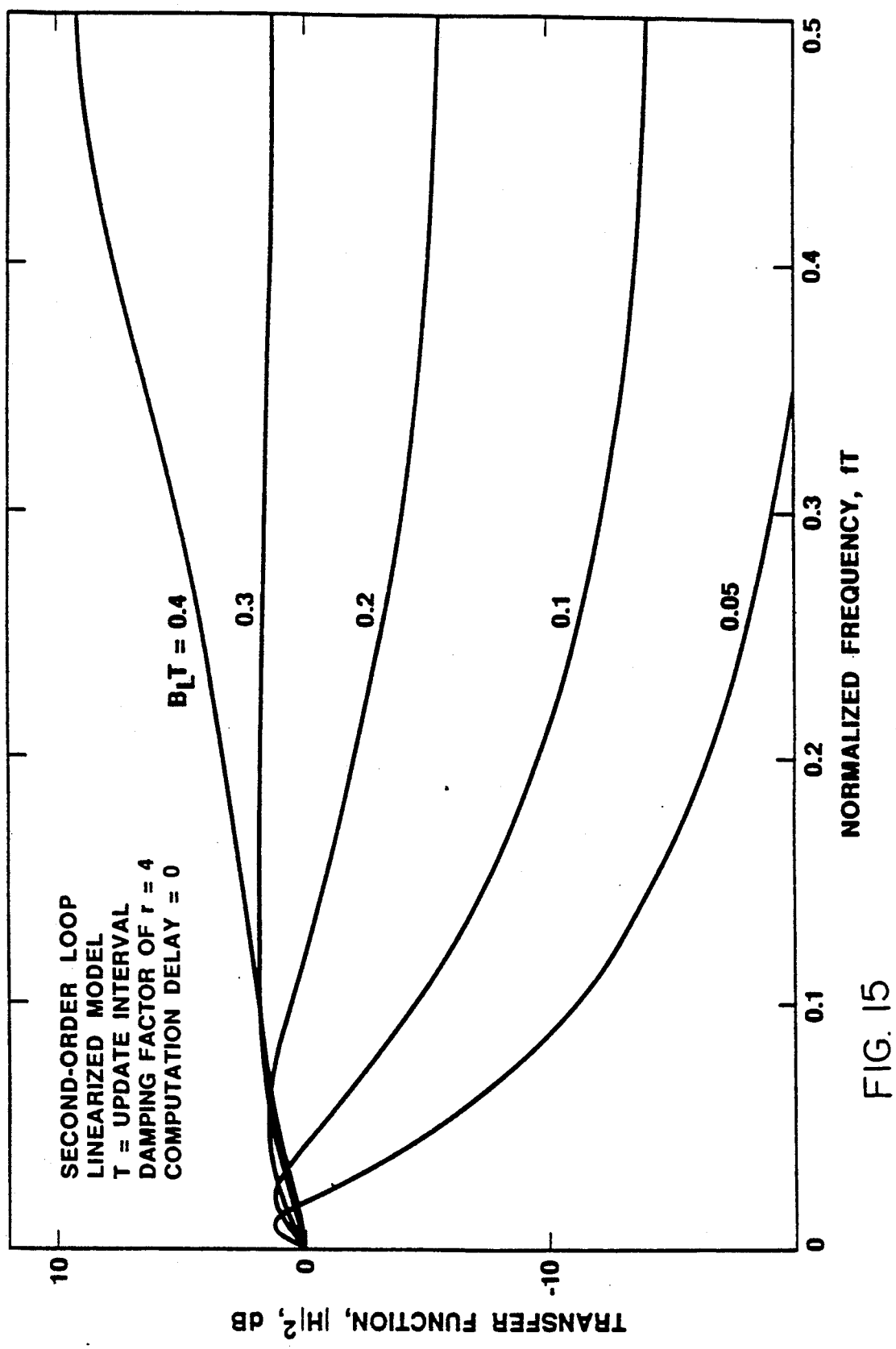
FIG. 15 is a graphical illustration of the frequency response of a digital phase-lock loop with phase and rate feedback.

We now derive and analyze the closed-loop transfer-function for a phase/rate DPLL with a negligible computation delay. In addition, performance for a phase/rate DPLL with a computation delay of one update interval is presented in terms of loop noise bandwidth and stability limits. FIG. 9. For example, when $B_LT=0.2$, $r=2$, and the computation delay is zero, the loop noise bandwidth for the phase/rate design is 1 dB lower than for the rate-only design. A comparison of FIGS. 8 and 15 shows that the frequency response for a phase/rate DPLL is less singular than for a rate DPLL for large $B_LT$. Similar comparisons can be made for DPLLs with a computation delay of one update interval, as exemplified by loop noise bandwidth in FIG. 9.

C.4 Dynamic Tracking Errors

Dynamic response of a phase/rate DPLL is presented below for the same input phase functions as the rate-only loop.

A recursive difference equation relating input phase, $\phi_n$ with model-phase, $\phi_n^m$, is obtained by substituting Equation (2) in Equation (10), with residual-phase, $\delta\phi_n$ set equal to input phase minus model-phase. A z transform can be applied to this difference equation to obtain the closed loop transfer-function that maps input phase to model-phase. Again, a linearized model of the loop will be assumed. The closed loop transfer-function for phase/rate DPLL with a negligible computation delay becomes $$H(z) = \frac{K_1(z-1) + K_2 z}{(z-1)^2 + K_1(z-1) + K_2 z} \quad (11)$$

Figure 16:
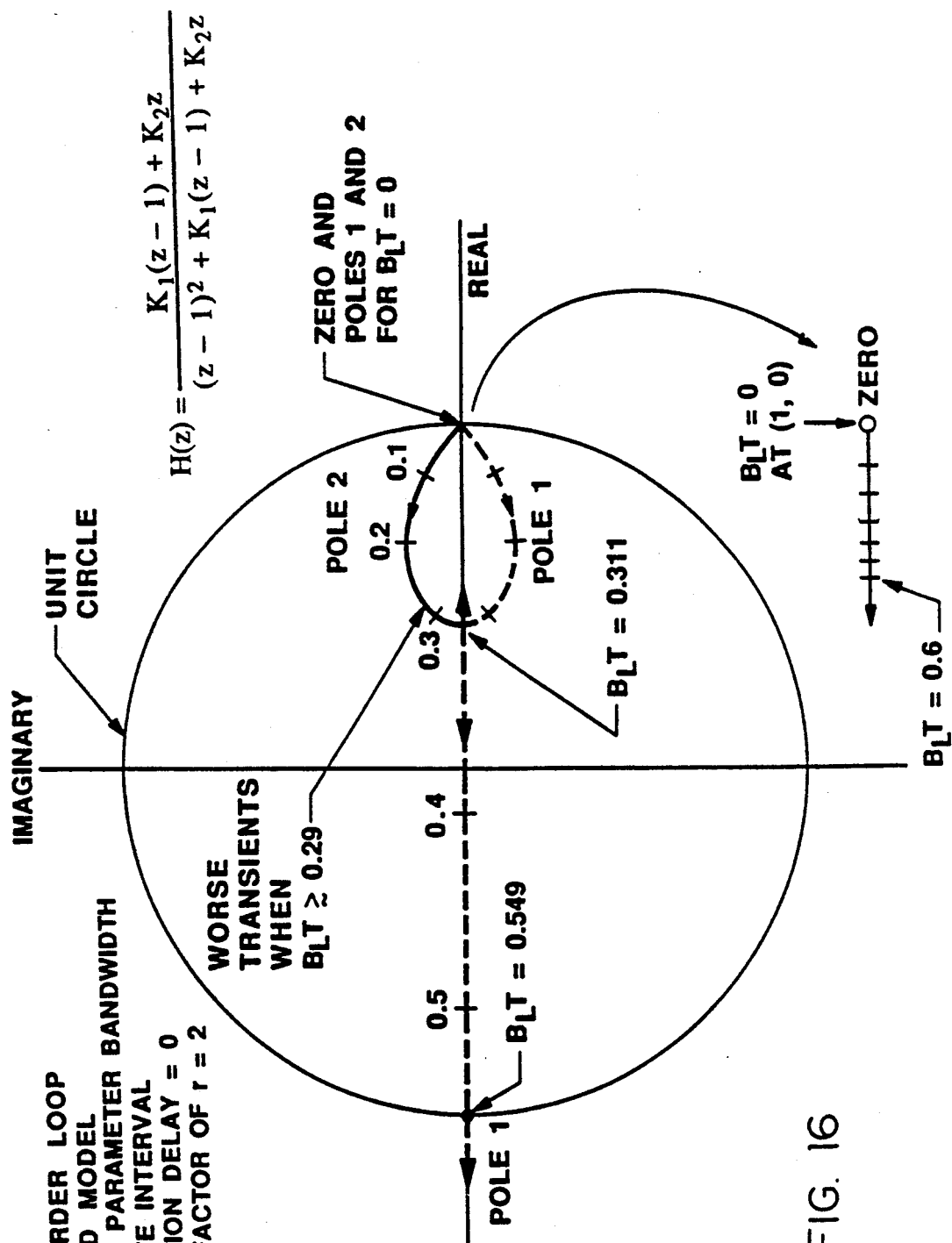
FIG. 16 is a graphical illustration of the root-loci for a first case of a digital phase-lock loop with phase and rate feedback.
Figure 17:
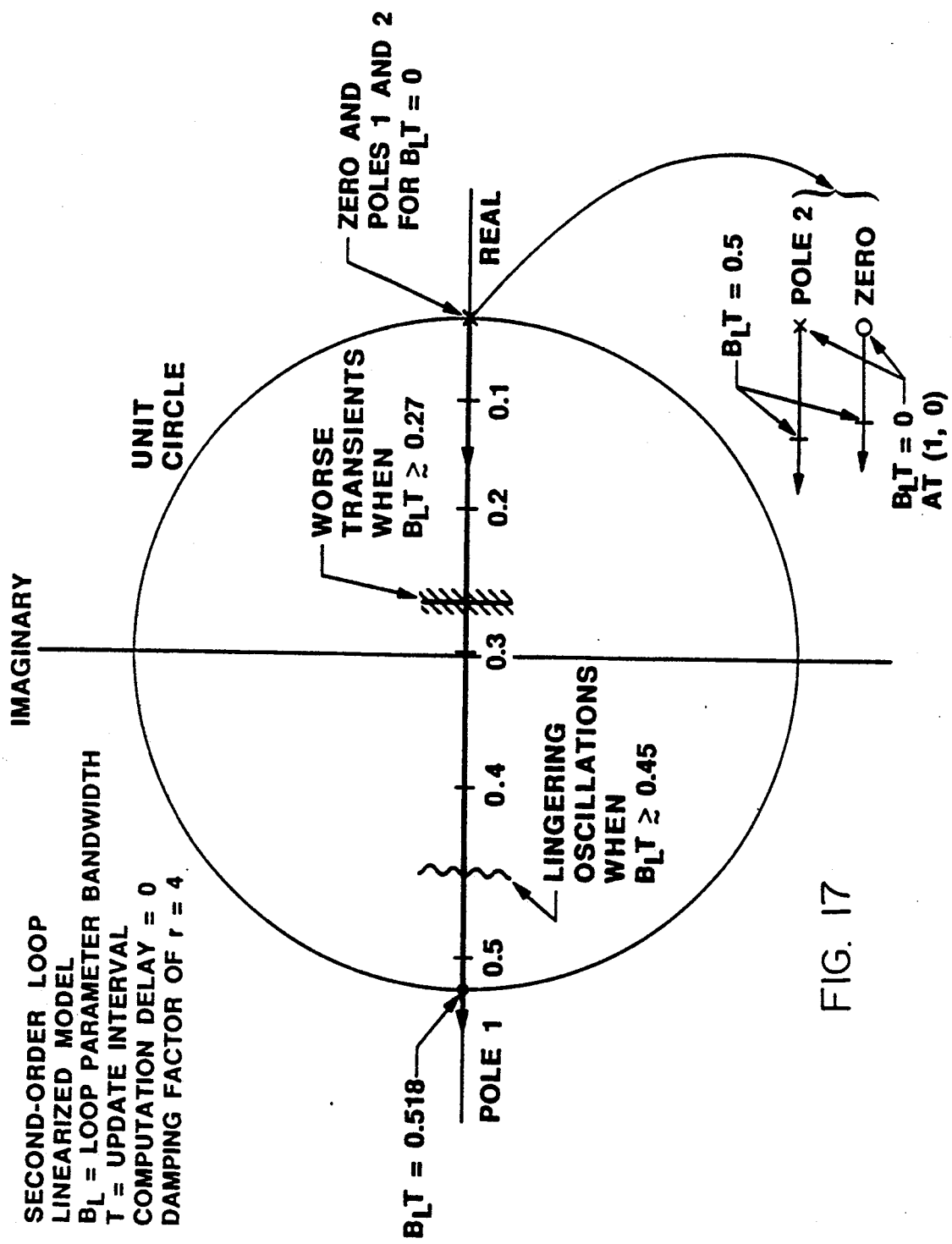
FIG. 17 is a graphical illustration of the root-loci for a second case of a digital phase-lock loop with phase and rate feedback.

In analogy with the earlier example, one can compute from this function loop frequency responses, loop noise bandwidths, and root-locus plots, as shown in FIGS. 15 through 17. As seen in FIGS. 16 and 17, a pole of the transfer-function for a phase/rate DPLL punches through the unit circle at $fT=0.5$, and at a significantly higher value of $B_LT$ ($>0.5$) than for a rate-only DPLL. Furthermore, the pole paths for a phase/rate DPLL generally stay more in the interior of the unit circle. Consequently, the loop noise bandwidth is significantly lower for a phase/rate DPLL when $B_LT>0.15$ as shown in

C.4a Transient Response

Figure 18:
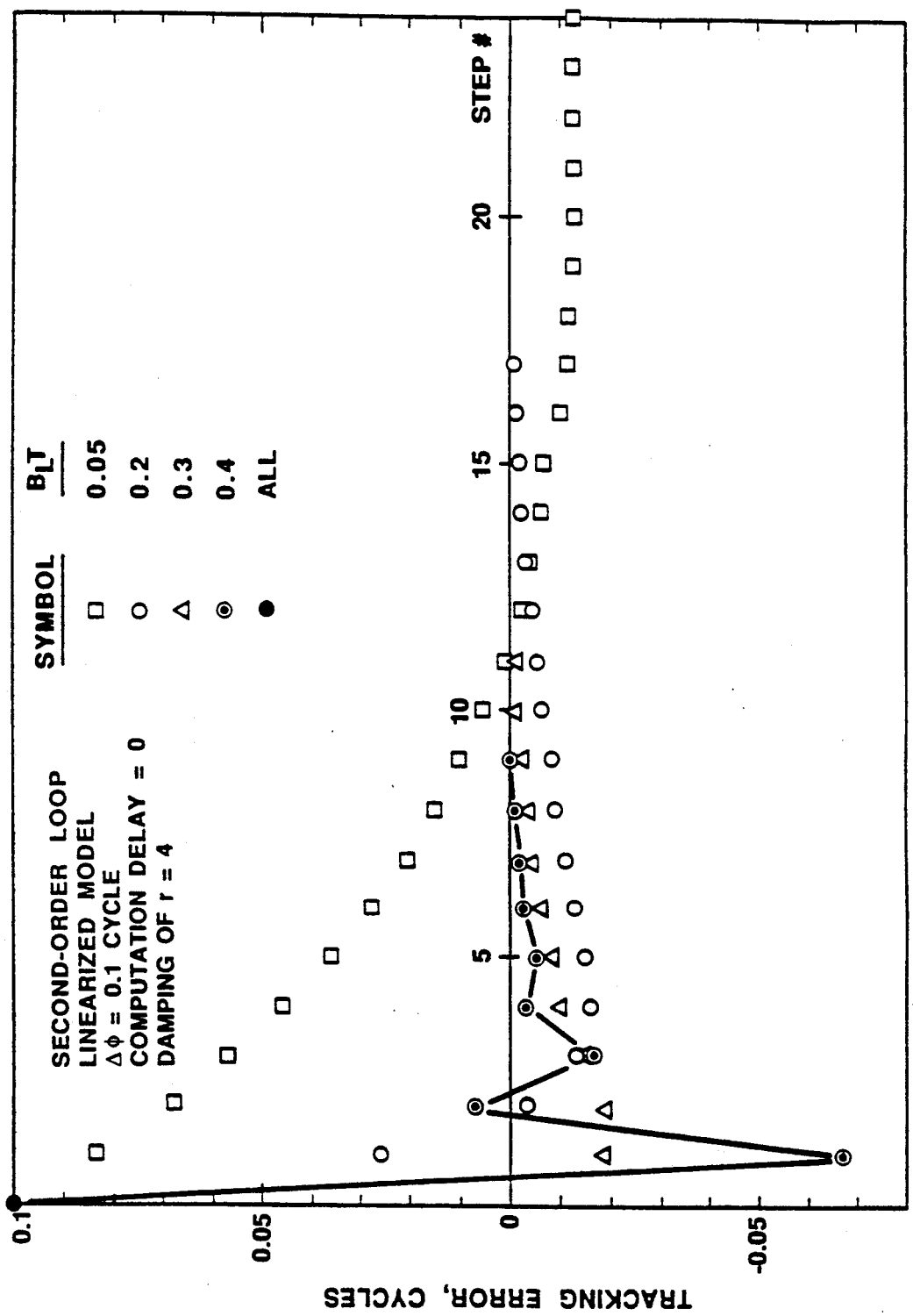
FIG. 18 is a graphical illustration of the transient response after a phase step for a digital phase-lock loop with phase and rate feedback.

Simulation software for a phase/rate DPLL has been used to determine loop response to phase dynamics. Loop response to a phase step is presented in FIG. 18 for several values of $B_LT$, a damping factor of 4, and negligible computation delay. As one would expect, transient errors decrease with increasing $B_LT$ as long as $B_LT$ is small, but begin to increase for larger values of $B_LT$. In FIG. 18, note the increase in transient errors for $B_LT=0.4$. More detailed simulations indicate that RSS transient error after a phase step will decrease as $B_LT$ increases until $B_LT$ reaches about 0.27 when $r=4$ (or about 0.29 when $r=2$). Lingering oscillations for $r=4$ do not begin until $B_LT>0.45$. This indicates there is a considerable range of relative stability above $B_LT=0.27$, provided the application can tolerate the greatly increased loop noise bandwidth.

These upper limits for $B_LT$ in a phase/rate DPLL are summarized in Table III. The loose upper limits based on pole crossings are 0.549 and 0.518 for $r=2$ and 4, respectively. The more conservative limit based on lingering oscillations is 0.45 for $r=4$. The most conservative limits, based on RSS transient response after a phase step, are 0.29 and 0.27 for $r=2$ and 4, respectively.

Similar limits can be set for a phase/rate DPLL with a computation delay of one update interval. The limits on $B_LT$ set by the transient-response criteria are shown in FIG. 9.

Figure 19:
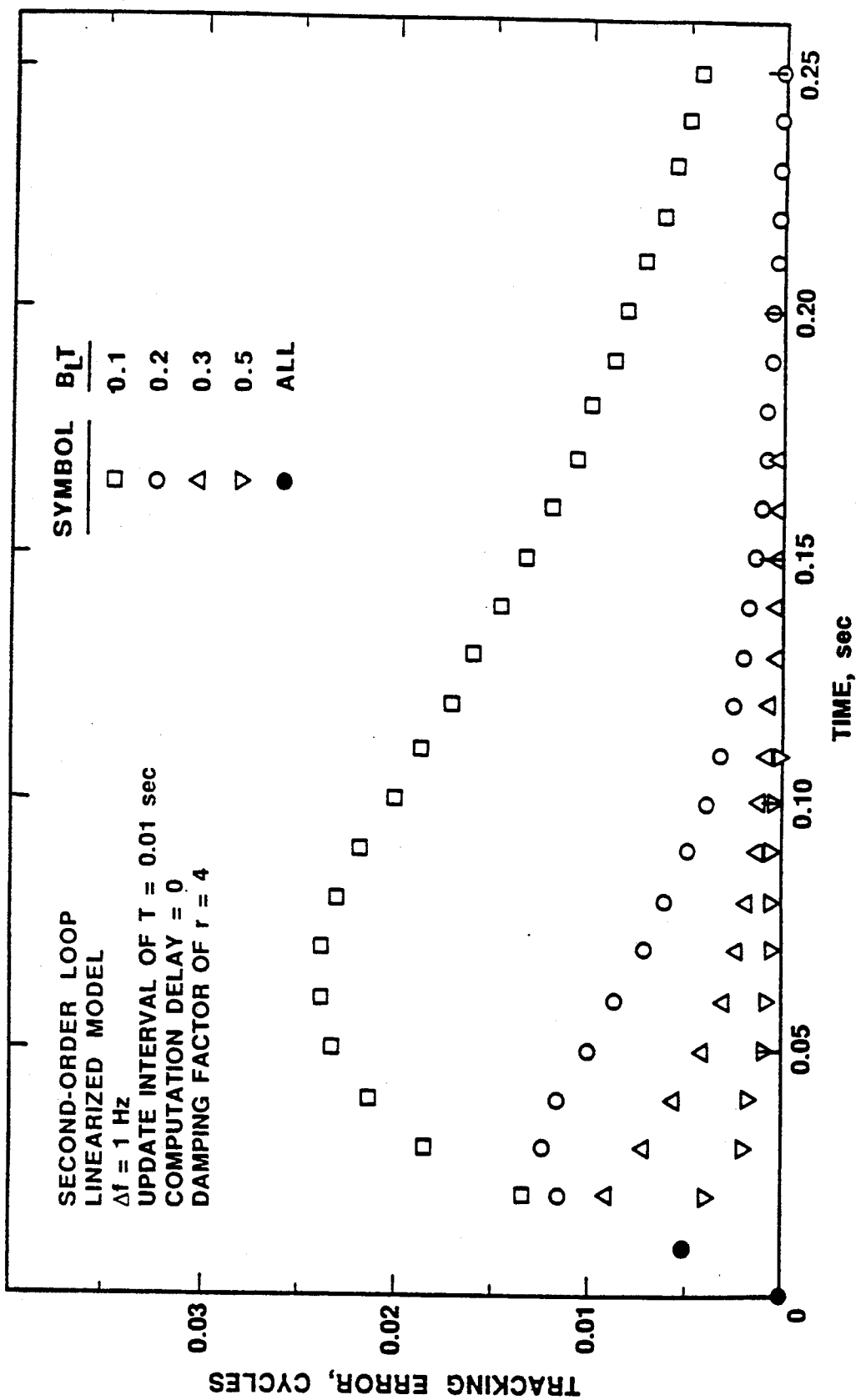
FIG. 19 is a graphical illustration of the transient response after a phase-rate step for a digital phase-lock loop with phase and rate feedback.

Loop response to a phase-rate step is shown in FIG. 19 for several values of $B_LT$, $r=4$, and negligible computation delay. As $B_LT$ increases, RSS transient response after a rate step continues to improve until $B_LT>0.45$, which is well past the maximum value of $B_LT=0.27$ provided by the more stringent phase-step criterion. The approximate formula used above for estimating a maximum phase-rate step for a rate-only DPLL also applies to a phase/rate DPLL.

C.4b Steady-state Response

The steady-state response of a phase/rate DPLL to quadratic phase behavior is the same as the response of a rate/only DPLL, as outlined above.

D. High-Performance Feedback Without Dead-Time

When the phase information from one interval is used to help update the very next interval, the time required for computation can lead to a "dead-time" during which sampled data are not processed and are therefore lost. With proper specification of feedback, the dead time can be eliminated with very little sacrifice in tracking performance. Model and feedback computations that use the phase information from the interval just completed are carried out during the first fraction of a sum interval as the counter-rotation continues to use the feedback phase carried forward from the interval just completed. Tracking performance is ensured by requiring average feedback phase to satisfy the update relation in equation (10). The small price paid for this saved data is a small loss of SNR due to phase mismatch across interval during high dynamics. The following paragraphs outline the method for a particular embodiment.

One can easily show that, in linear approximation, the residual-phase for the kth interval is theoretically given by the difference of the average of actual phase and NCO phase:

$$\delta\phi_k = \bar{\phi}_k - \bar{\phi}_k^R \quad (12)$$

where $\phi_k$ and $\phi_k^R$ are actual phase and NCO phase, respectively, and the bar denotes an average across the sum interval:

$$\bar{\phi}_k^R = \frac{1}{T} \int_0^T \phi_k^R(t)\, dt \quad (13)$$

and similarly for actual phase. (It is assumed that the dead-time is zero so that $T'=T$). This relation for residual phase shows that dynamic tracking error is determined by averaged NCO phase and is not dependent on its detailed time variations across a sum interval. (Detailed time variations can result in a loss in amplitude and SNR if they deviate too much for actual phase, however.)

Figure 20:
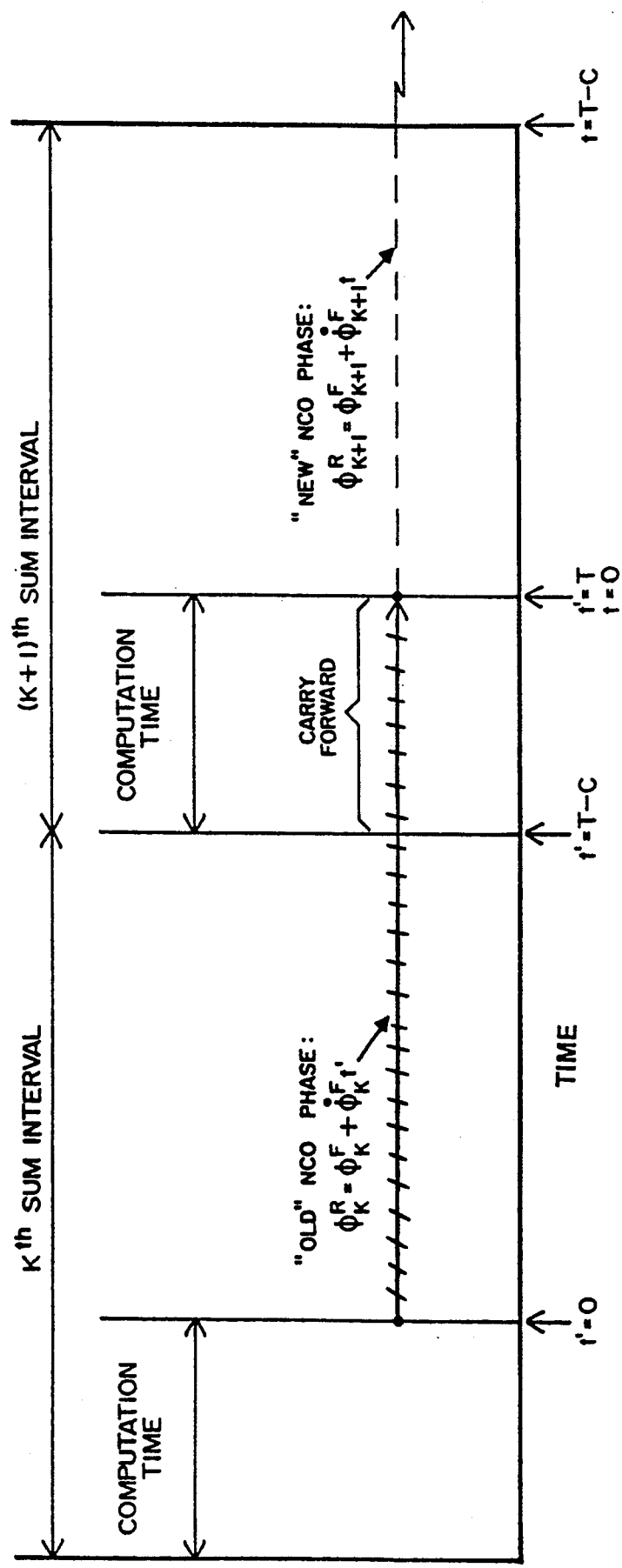
FIG. 20 is an illustration of sum intervals and feedback segments when NCO phase is carried forward into the first part of the next interval.

In an embodiment in which the loop filter estimates phase rate, this attribute of measured residual phase suggests that the estimated phase rate will be efficiently used if one requires $$\overline{\phi}_{k+1}^R = \phi_{k+1}^m \tag{14}$$

for each interval where $\phi_{k+1}^m$ is computed by means of Equation (10) where the phase change $\Delta\phi_{k+1}^T$ is based on the phase rate calculated using the phase information of the most recent interval (k). To illustrate the method, let C be the time required for computation and let the old NCO phase from the previous interval (k) carry over from zero to C in interval k+1 as illustrated in FIG. 20. Under the assumption of linear NCO phase, let $\phi_k^F$ and $\dot{\phi}_k^F$ be the phase and rate feedback for the kth interval. The average NCO phase across the (k+1)th interval becomes $$\overline{\phi}_{k+1}^R = \tag{15}$$

$$\frac{1}{T}\left[\int_{T-C}^{T}(\phi_k^F + \dot{\phi}_k^F t')dt' + \int_0^{T-C}(\phi_{k+1}^F + \dot{\phi}_{k+1}^F t)dt\right]$$

where it is assumed that each feedback phase and rate are defined so that t=0 at the time at which feedback is inserted in the NCO register. The first integral is the contribution of the NCO phase carried over from the preceding sum interval while computation is being carried out and the second integral is the contribution of the new feedback over the rest of the sum interval. This expression becomes $$\overline{\phi}_{k+1}^R = \frac{1}{T}\left(\phi_k^F C + \frac{\dot{\phi}_k^F}{2}[T_2 - (T-C)^2] + \right. \tag{16}$$

$$\left. \phi_{k+1}^F (T-C) + \frac{\dot{\phi}_{k+1}^F}{2}(T-C)^2\right)$$

As explained above, this average is forced to equal the model phase predicted for the (k+1)th interval by Equation (10):

$$\overline{\phi}_{k+1}^R = \phi_{k+1}^m = \phi_k^m + \Delta\phi_{k+1}^T \tag{17}$$

Suppose that both phase and phase-rate are to be updated. For this embodiment, feedback values are obtained by: a) setting the feedback rate for each update equal to the rate estimate predicted by the loop filter, as before; and b) making the feedback phase for each interval satisfy Equation (17). Solving Equations (16) and (17) for $\phi_{k+1}^F$, one obtains $$\overline{\phi}_{k+1}^F = \frac{1}{T-C}\left[\phi_{k+1}^m T - \dot{\phi}_k^F C - \frac{\dot{\phi}_k^F}{2}(2TC - C^2) - \right. \tag{18}$$

$$\left. \frac{\dot{\phi}_{k+1}^F}{2}(T-C)^2\right]$$

Since all of the quantities on the right of this equation are known (or can be calculated) during the computation time, $\phi_{k+1}^F$ can be easily calculated and used. The computation time C must be sufficiently large to allow these calculations to be completed.

Thus, in this example, if the rate feedback for each update is set equal to the most recent loop-filter estimate and if the feedback phase is computed according to Equation (18), then the average feedback phase will satisfy Equation (17) and the superior performance of the pure phase/rate DPLL outlined earlier will be realized without loss of computation-time data. In high-dynamics applications, a small loss in SNR might be incurred due to small phase mismatch caused by the feedback-phase carry-over into the next interval.

Even though the analysis starts with residual phase in Equation (12), the above approach will also work when the phase error signal is unnormalized. Further, this same "average-NCO-phase" approach can be used to eliminate dead-time for any method of forecasting phase over the next interval. Suppose residual-phase and/or phase values of completed intervals and other information are combined in some way to predict a time dependence of phase over the next interval. As above, the feedback phase of the previous interval (k) can be carried over into the counter-rotation sum of the (k+1)th interval. In analogy with the example above, the phase constant (or other phase parameters) of the (k+1)th interval can be adjusted to compensate for the average error caused by this sub-optimal carry-forward. The desired phase projection will then have been applied in an average sense.

The average nature of residual phase exhibited in Equation (12) also provides a method for accurately extracting measured phase. Measured phase is extracted for each sum interval by adding residual phase to the average NCO phase for the interval:

$$\phi_{Obs} = \delta\phi_k + \overline{\phi}_k^R \tag{19}$$

$$= \overline{\phi}_k \tag{20}$$

This method for extracting phase removes tracking error from measured phase and decorrelates noise between sum-intervals. As implied by Equation (20), the measured value will be equal to the $\overline{\phi}_k$, the actual phase averaged across the sum interval. This method for extracting phase can be applied to any DPLL once average NCO phase is known, and residual phase is extracted for an interval. Care must be taken in assigning integer cycles to NCO phase in this process if only NCO phase is known. In the method outlined above, of course, average NCO phase is forced to equal the model phase of Equation (17) and does not have to be separately calculated.

E. Loop Control Methods

Analysis of the loop equations can lead to techniques for setting the loop filter sums in a standard loop filter when the loop is initialized or when loop gain is changed. To illustrate the approach, a third-order loop will be analyzed. The loop-filter equation for the (n+1)th phase change per update interval T is given by $$\Delta\phi_{n+1}^T = K_1 \delta\phi_n + K_2 \sum_{k=1}^{n} \epsilon\phi_k + K_3 \sum_{m=1}^{n} \sum_{k=1}^{m} \delta\phi_k \tag{21}$$

where $K_1$, $K_2$, and $K_3$ are the loop constants. Based on this equation, the second difference becomes $$\Delta^2\phi_{n+1}^T = \Delta\phi_{n+1}^T - \Delta\phi_n^T \quad (22)$$

$$= K_1[\delta\phi_n - \delta\phi_{n-1}] + K_2\delta\phi_n + K_3\sum_{k=1}^{n}\delta\phi_k$$

Suppose that loop tracking is to be initiated and that estimates of phase and the first and second phase differences have been obtained for the required time point (e.g. by FFT analysis and/or a priori information).

The estimates for the phase differences can be substituted in the left-hand side of Equations (21) and (22) and a solution performed for the two loop filter sums. The simplest approach, which is suitable for relatively small loop gain ($K_1 < 0.2$) or for small tracking errors, is to set the $K_1$ terms and the $K_2\delta n\phi_n$ term equal to zero. In this case, the solution for the loop-filter sums is given in terms of the estimated phase differences by $$\Sigma\delta\phi = \Delta^2\phi_{n+1}^T/K_3 \quad (23)$$

$$\Sigma\Sigma\delta\phi = \frac{1}{K_3}\left[\Delta\phi_{n+1}^T - \frac{K_2}{K_3}\Delta^2\phi_{n+1}^T\right] \quad (24)$$

When these values are substituted in the loop filter and the NCO phase is initiated with an accurate estimate, the loop will start off in lock. More sophisticated initializations are possible. For example, in steady-state tracking, the residual phase can be calculated on the basis of an estimate of the third derivative of phase and substituted in Equations (21) and (22). When these equations are then solved for the loop-filter sums, better estimates will be obtained for that particular application.

The same basic approach can be used to reset the loop-filter sums when loop constants (gain) are changed between update intervals. At the completion of a given sum interval (n), the existing sum values can be used to estimate the phase differences in Equations (21) and (22) with the old loop constants. These phase differences can then be substituted in Equations (23) and (24) along with the new loop constants to obtain estimates for the new sum values. In subsequent phase-rate estimates, these new sum values can then be used in the loop-filter equation along with the new loop constants. This procedure will produce rate estimates consistant with previous tracking and thereby allow gain change without loss of lock.

Since residual phase is neglected, this approach can cause transients as tracking error settles, but these transients will be small if loop gain is relatively small ($K_1 < 0.2$). More sophisticated variations to this technique are possible. For example, in appropriate applications, steady-state residual phase can be estimated before and after the gain changes and incorporated in the equations.

This same approach can be adapted to orders lower and higher than third order, with an appropriate number of loop-filter sums to be adjusted for each. For example, with a fourth-order loop, there will be an additional third phase difference ($\Delta^3$) equation, for a total of three equations. These three equations can be solved for the three sum unknowns.

F. Variations

The designs outlined above can be extended in a straight-forward way from a second-order loop filter to higher- or lower-order loop filters and from a linear-phase NCO to a quadratic or higher-order time dependence. If other types of modeling rather than conventional loop filters are used to process residual-phase and/or phase, for the purpose of estimating phase rate, the algorithm outlined above for supplying feedback to the NCO could still be used. Also, more complicated processing that predicts more complicated phase-models could be accommodated by these NCO-feedback techniques. All of the techniques can still be applied if the sampled signal is non-quadrature or if the counter-rotation is carried out with a nonquadrature multiplier (sine or cosine). Loop variations such as rate-aiding with external information and Costas loop configurations can be improved by these techniques. The techniques can also be used to improve delay-lock loops. Accumulation of counter-rotation products can be carried out with a digital filter rather than a sum. If instantaneous phase is desired rather than sum-interval-averaged phase, the average phase can be corrected to remove sum-interval-averaged values of higher order terms in phase time variation. The model-phase or average-phase update in Equation (10) can be obtained by rate-only feedback given approximate rate adjustments, but phase mismatch will be worse than with phase/phase-rate feedback. Updating of phase each interval makes this technique very adaptable to multiplexing the same loop between different sampled signals.

G. Summary and conclusions

It will now be understood that what has been disclosed herein comprises digital phase-locked loops (DPLLs) having two major components: a counter-rotation processor (CP) and a tracking processor (TP). The CP operates at the input sample rate to generate counter-rotation phasors, to counter-rotate the sampled signal, and to accumulate the counter-rotated signal over an accumulation interval. The TP, which carries out its computations much less frequently (e.g., once per accumulation interval), extracts residual phase; calculates model phase, NCO feedback and accumulation interval start time; and computes output phase and the associated time tag.

Distinctive features of the DPLL embodiments disclosed herein include accurate timing and time-tag computation, accurate computation of measured phase by the tracking processor through modeling (including integer cycles), removal of the tracking error in measured phase through use of residual phase, updating of the NCO in phase as well as rate, amplitude-insensitive phase extractors, a method to avoid loss of data during computation time and a method to change loop gain during a track without loss of lock. Further, as illustrated in FIG. 14 for the preferred embodiment, the present invention precalculates the model phase for a future interval, including integer and fractional cycles, and then constructs feedback that will cause the NCO to attain that phase in said interval. In contrast, as shown in FIG. 7, a conventional DPLL precalculates only rate feedback to be forced on the NCO and then later "reads" or models the NCO to find out how the phase of the NCO has reacted to said rate feedback. "Integer-cycle build-up" is also counted (or modeled) after feedback has been generated. This distinction is evident in the difference in FIGS. 7 and 14. FIG. 14 has a control line leaving the "Next Model Phase" operation and going to a feedback calculation, whereas FIG. 7 has no such line leaving said operation. This added feature in FIG. 14 enhances flexibility in controlling the NCO.

Two DPLL designs have been analyzed in terms of root-loci plots, loop noise bandwidth, maximum loop gain, and dynamic response. Both designs are based on a conventional loop-filter but one updates only the rate of the NCO while the other updates both phase and rate. For each, the computation delay is set either to a negligibly small value or to one update interval. Maximum loop gain has been determined for these DPLLs on the basis of two criteria: RSS transient response or the onset of lingering oscillations. These two criteria provide a more conservative and realistic method for setting maximum gain than computation of the point at which a pole of the transfer-function crosses of the unit circle.

The phase/rate DPLL can operate at substantially higher loop gains than the rate-only DPLL. When the computation delay is negligible, loop parameter bandwidth in the phase/rate DPLL can be increased to about $B_L T = 0.27$ before transient response to a phase step begins to deteriorate. In contrast, the transient response of a rate-only DPLL begins to deteriorate when $B_L T$ reaches about 0.2. If lingering oscillations following a phase step are taken as the criterion for instability, $B_L T$ can be increased to 0.45 for a phase/rate DPLL but only to 0.27 for a rate-only DPLL. For high loop gains, the phase/rate DPLL has lower loop noise bandwidth. For example, when $B_L T = 0.2$, the loop noise bandwidth of the phase/rate DPLL is 0.5 to 1 db smaller than for a rate-only DPLL. These results indicate that a phase/rate DPLL will outperform a rate-only DPLL by a substantial margin at high loop gain.

When the computation delay is one update interval, the phase/rate DPLL still substantially outperforms the rate-only DPLL at high loop gains. With regard to phase-step transient response, $B_L T$ can be increased to 0.12 for the phase/rate DPLL but only to 0.09 for the rate-only DPLL. The lingering-oscillation test limits $B_L T$ to 0.14 for the rate-only DPLL but to 0.18 for the phase/rate DPLL. When $B_L T = 0.1$, loop noise bandwidth is about 0.6 db smaller for the phase/rate DPLL than for a rate-only DPLL.

In order to have well-defined, constant loop gain and damping, only amplitude-insensitive phase extractors have been considered. Two types of amplitude-insensitive phase extractors have been analyzed: arctangent and sine. In applications with adequate SNR, an arctangent extractor can be used with high accuracy over a wide range of residual-phase. When SNR is low, a sine extractor can outperform an arctangent extractor. If a sine extractor is used and if amplitude is slowly varying, normalization schemes can be implemented that largely eliminate sensitivity to amplitude fluctuations, without a substantial amplification of noise. Since sine extractors can allow smaller values for sum-interval, design flexibility with regard to parameter loop bandwidth and computation delay can be improved by using such an extractor.

A method has been presented that will eliminate loss of data (dead time) due to computation delay, with very little loss of tracking performance. In this method, carry-over of NCO phase from the previous accumulation interval allows counter-rotation to continue during computation. NCO feedback for each update is adjusted to compensate in an average sense, for the suboptimal NCO phase applied during the carry-over period. In this manner, tracking performance, which depends on average NCO phase, can closely approximate performance obtained with instantaneous computation and update.

Phase accuracy of measured phase can be improved in dynamic applications by computing measured phase as the sum of average NCO model phase and residual phase. This operation removes the dynamic tracking error. A precise time-tag can be supplied with each phase value by implementing a real-time clock driven by the sample clock and by exact control of sum-interval start/stop times in terms of this real-time clock.

Those having skill in the art to which the present invention pertains will, as a result of the applicant's teaching herein, perceive various modifications and additions which may be made to the invention. However it will be understood that all such modifications and additions are deemed to be within the scope of the present invention which is to be limited only by the claims appended hereto.

I claim:

1. A digital phase-locked loop for tracking the phase of a signal supplied in the form of digital samples, comprising:
   a) means responsive to feedback, for generating counter-rotation phase;
   b) means for generating a counter-rotated signal in which said counter-rotation phase is subtracted from said phase of said signal;
   c) means responsive to at least one counter-rotated signal, for generating residual phase with a normalized sine phase extractor; and
   d) means responsive to said residual phase, for generating said feedback for the counter-rotation phase means.

2. A digital phase-locked loop for tracking the phase of a signal supplied in the form of digital samples, comprising:
   a) means responsive to feedback, for generating counter-rotation phase;
   b) means for generating a counter-rotated signal in which said counter-rotation phase is subtracted from said phase of said signal;
   c) means for combining counter-rotated-signal values over a selected accumulation interval to obtain a composite counter-rotated signal;
   d) means responsive to at least one composite counter-rotated signal, for generating a measure of difference in said phase of said signal and said counter-rotation phase;
   e) means responsive to phase-difference measure, for generating said feedback for the counter-rotation-phase means; and
   f) means for generating an average counter-rotation phase for an accumulation interval; and
   g) means for extracting measured phase for an accumulation interval as the sum of difference-phase measure and said average counter-rotation phase.

3. A digital phase-locked loop for tracking the phase of a signal supplied in the form of digital samples comprising:
   a) means responsive to feedback, for generating counter-rotation phase;
   b) means for generating a counter-rotated signal in which said counter-rotation phase is subtracted from said phase of said signal;
   c) means for combining counter-rotated signal values over a selected accumulation interval to obtain a composite counter-rotated signal;

d) means responsive to at least one composite counter-rotated signal, for generating a measure of difference in said phase of said signal and said counter-rotation phase;

e) means responsive to phase-difference measure, for using a loop filter to generate an estimate of phase rate;

f) means responsive to estimated phase rate, for generating a model phase for the next interval wherein the z-transform of the closed-loop transfer function relating model phase to signal phase is given by:

$$\frac{K_1(z-1) + K_2 z}{(z-1)^2 + K_1(z-1) + K_2 z}$$

where $K_1$ and $K_2$ are the loop filter constants; and g) means for generating said feedback to the counter-rotation phase means to attain said model phase, based on said estimated phase rate.

4. A digital phase-locked loop for tracking the phase of a signal supplied in the form of digital samples comprising:

a) means responsive to feedback, for generating counter-rotation phase;

b) means for generating a counter-rotated signal in which said counter-rotation phase is subtracted from said phase of said signal;

c) means for combining counter-rotated-signal values over a selected accumulation interval to obtain a composite counter-rotated signal;

d) means responsive to at least one composite counter-rotated signal, for generating a measure of difference in said phase of said signal and said counter-rotation phase;

e) means responsive to phase-difference measure, for using a loop filter to generate an estimate of phase rate;

f) means responsive to said estimated phase rate, for projecting a model phase;

g) means for generating said feedback to the counter-rotation phase means to attain said projected model phase, based on said estimated phase rate.

5. A digital phase-locked loop for tracking the phase of a signal supplied in the form of digital samples comprising:

a) means responsive to feedback, for generating counter-rotation phase;

b) means for generating a counter-rotated signal in which said counter-rotation phase is subtracted from said phase of said signal;

c) means for combining counter-rotated-signal values over a selected accumulation interval to obtain a composite counter-rotated signal;

d) means responsive to at least one composite counter-rotated signal, for generating a measure of the difference in said phase of said signal and counter-rotation phase; and e) means responsive to phase-difference measure from said selected accumulation interval for generating feedback for the very next interval with no increase in dynamic tracking error and no loss of signal samples because of the time required to generate said feedback.

6. A digital phase-locked loop for tracking the phase of a signal supplied in the form of digital samples comprising:

a) means responsive to feedback, for generating counter-rotation phase for a selected interval;

b) means for generating a counter-rotated signal in which said counter-rotation phase is subtracted from said phase of said signal;

c) means for combining counter-rotated signal values over a selected interval to obtain a composite counter-rotated signal;

d) means responsive to at least one composite counter-rotated signal, for generating a measure of difference in said phase of said signal and said counter-rotation phase;

e) means responsive to said phase-difference measure, for using a loop filter to generate an estimate of phase change;

f) means for generating model phase for a selected interval where said model phase is equal to the model phase for the previous interval plus said estimate of phase change; and g) means for generating said feedback to the counter-rotation phase means to attain said model phase based upon model phase of said previous interval and said estimate of phase change.

7. A digital phase-locked loop for tracking the phase of a signal supplied in the form of digital samples, comprising:

a) means responsive to both phase feedback and phase-rate feedback, for generating counter-rotation phase for a selected counter-rotation interval;

b) means for generating a counter-rotated signal in which said counter-rotation phase is subtracted from said phase of said signal;

c) means for combining counter-rotated-signal values over a selected accumulation interval to obtain a composite counter-rotated signal;

d) means responsive to at least one composite counter-rotated signal, for generating a measure of difference in said phase of said signal and said counter-rotation phase;

e) means responsive to phase-difference measure, for generating an estimate of signal-phase rate using a loop filter;

f) means responsive to estimated signal-phase rate, for generating for another selected counter-rotation interval, both phase feedback and phase-rate feedback for the counter-rotation phase means, without requiring continuity in counter-rotation phase from interval to interval.

8. A digital phase-locked loop for tracking the phase of a signal supplied in the form of digital samples, comprising:

a) means responsive to feedback, for generating counter-rotation phase;

b) means for generating a counter-rotated signal in which said counter-rotation phase is subtracted from said phase of said signal;

c) means responsive to at least one counter-rotated signal, for generating a measure of difference in said phase of said signal and said counter-rotation phase;

d) means responsive to phase-difference measure, for using a loop filter to generate feedback for the counter-rotation phase means;

e) means for changing the loop filter and analytically resetting the loop during tracking, without losing lock.

9. A digital phase-locked loop of at least third order for tracking the phase of a signal supplied in the form of digital samples, comprising:
   a) means responsive to feedback, for generating counter-rotation phase;
   b) means for generating a counter-rotated signal in which said counter-rotation phase is subtracted from said phase of said signal;
   c) means responsive to at least one counter-rotated signal, for generating a measure of difference in said phase of said signal and said counter-rotation phase;
   d) means responsive to phase-difference measure, for using a loop filter to generate said feedback for the counter-rotation phase means; and
   e) means for acquiring loop lock of said signal by analytically initializing the loop.

10. A digital phase-locked loop characterized by a loop phase for tracking the phase of a signal supplied in the form of digital samples, comprising:
   a) means responsive to feedback, for generating counter-rotation phase;
   b) means for generating a counter-rotated signal in which said counter-rotation phase is subtracted from said phase of said signal;
   c) means responsive to at least one counter-rotated signal, for generating a measure of difference in said phase of said signal and said counter-rotation phase;
   d) means responsive to phase-difference measure, for using a loop filter to generate said feedback for the counter-rotation phase means; and
   e) means for acquiring loop lock of said signal by analytically initializing the loop, including loop phase.

11. A method for tracking with a digital phase-locked loop the phase of a signal supplied in the form of digital samples, the method comprising the steps of:
   a) generating counter-rotation phase responsive to feedback;
   b) generating a counter-rotated signal in which said counter-rotation phase is subtracted from said phase of said signal;
   c) generating residual phase with a normalized sine phase extractor responsive to at least one counter-rotated signal;
   d) generating said feedback responsive to residual phase; and
   e) supplying the feedback of step d) to step a) and repeating steps a) to e).

12. A method for tracking with a digital phase-locked loop the phase of a signal supplied in the form of digital samples, the method comprising the steps of:
   a) generating counter-rotation phase responsive to feedback;
   b) generating a counter-rotated signal in which said counter-rotation phase is subtracted from said phase of said signal;
   c) combining counter-rotated signal values over a selected accumulation interval to obtain a composite counter-rotated signal;
   d) generating a measure of difference in said signal phase and counter-rotation phase, wherein said measure is responsive to at least one composite counter-rotated signal;
   e) generating feedback responsive to phase-difference measure;
   f) generating an average counter-rotation phase for an accumulation interval; and
   g) extracting measured phase for an accumulation interval as the sum of difference-phase measure and said average counter-rotation phase; and
   h) supplying the feedback of step e) to step a) and repeating steps a) to h).

13. A method for tracking with a digital phase-locked loop the phase of a signal supplied in the form of digital samples, the method comprising the steps of:
   a) generating counter-rotation phase responsive to feedback;
   b) generating a counter-rotated signal in which said counter-rotation phase is subtracted from said phase of said signal;
   c) combining counter-rotated signal values over a selected accumulation interval to obtain a composite counter-rotated signal;
   d) generating a measure of difference in said phase of said signal and said counter-rotation phase wherein said measure is responsive to at least one composite counter-rotated signal;
   e) using a loop filter responsive to phase-difference measure to generate an estimate of phase rate;
   f) generating through use of said estimated phase rate a model phase for the next interval wherein the z-transform of the closed-loop transfer function relating model phase to signal phase is given by:

$$\frac{K_1(z-1) + K_2 z}{(z-1)^2 + K_1(z-1) + K_2 z}$$

where $K_1$ and $K_2$ are the loop filter constants;
   g) generating feedback for the next interval in a manner that will cause step a) to attain said model phase, based upon said estimated phase rate; and
   h) supplying the feedback of step g) to step a) and repeating steps a) to h).

14. A method for tracking with a digital phase-locked loop the phase of a signal supplied in the form of digital samples, the method comprising the steps of:
   a) generating counter-rotation phase responsive to feedback;
   b) generating a counter-rotated signal in which said counter-rotation phase is subtracted from said phase of said signal;
   c) combining counter-rotated-signal values over a selected accumulation interval to obtain a composite counter-rotated signal;
   d) generating a measure of difference in said phase of said signal and said counter-rotation phase wherein said measure is responsive to at least one composite counter-rotated signal;
   e) using a loop filter responsive to phase-difference measure to generate an estimate of phase rate;
   f) projecting a model phase responsive to said estimated phase rate;
   g) generating said feedback that will cause step a) to attain said projected model phase, based upon said estimated phase rate; and
   h) supplying the feedback of step g) to step a) and repeating steps a) to h).

15. A method for tracking with a digital phase-locked loop the phase of a signal supplied in the form of digital samples, the method comprising the steps of:
   a) generating counter-rotation phase responsive to feedback;

b) generating a counter-rotated signal in which said counter-rotation phase is subtracted from said phase of said signal;

c) combining counter-rotated signal values over a selected accumulation interval to obtain a composite counter-rotated signal;

d) generating a measure of difference in said phase of said signal and said counter-rotation phase wherein said measure is responsive to at least one composite counter-rotated signal;

e) generating, through use of phase-difference measure from said selected accumulation interval, feedback for the very next interval, with no increase in dynamic tracking error and no loss of signal samples because of the time required to generate said feedback; and f) supplying the feedback of step e) to step a) and repeating steps a) to f).

16. A method for tracking with a digital phase-locked loop the phase of a signal supplied in the form of digital samples, the method comprising the steps of:

a) generating over a selected interval, counter-rotation phase responsive to feedback;

b) generating a counter-rotated signal in which said counter-rotation phase is subtracted from said phase of said signal;

c) combining counter-rotated signal values over a selected interval to obtain a composite counter-rotated signal;

d) generating a measure of difference in said phase of said signal and said counter-rotation phase wherein said measure is responsive to at least one composite counter-rotated signal;

e) using a loop filter responsive to phase-difference measure to generate an estimate of phase change;

f) generating model phase for a selected interval where said model phase is equal to the model phase for the previous interval plus said estimate of phase change;

g) generating said feedback to the counter-rotation phase means to attain said model phase based upon model phase of said previous interval and said estimate of phase change; and h) supplying the feedback of step g) to step a) and repeating steps a) to h).

17. A method for tracking with a digital phase-locked loop the phase of a signal supplied in the form of digital samples, the method comprising the steps of:

a) generating for a selected counter-rotation interval, counter-rotation phase responsive to feedback;

b) generating a counter-rotated signal in which said counter-rotation phase is subtracted from said phase of said signal;

c) combining counter-rotated signal values over a selected accumulation interval to obtain a composite counter-rotated signal;

d) generating a measure of difference in said phase of said signal and said counter-rotation phase wherein said measure is responsive to at least one composite counter-rotated signal;

e) using a loop filter responsive to phase-difference measure to generate an estimate of signal-phase rate;

f) generating through use of estimated signal-phase rate, both phase feedback and phase-rate feedback for another selected counter-rotation interval, without requiring continuity in counter-rotation phase from interval to interval; and g) supplying the feedback of step f) to step a) and repeating steps a) to g).

18. A method for tracking with a digital phase-locked loop the phase of a signal supplied in the form of digital samples, the method comprising the steps of:

a) generating counter-rotation phase responsive to feedback;

b) generating a counter-rotated signal in which said counter-rotation phase is subtracted from the said phase of said signal;

c) generating a measure of difference in said phase of said signal and said counter-rotation phase wherein said measure is responsive to at least one counter-rotated signal;

d) selectively changing loop filter and analytically resetting the loop during tracking, without losing lock;

e) using a loop filter responsive to phase-difference measure to generate said feedback; and f) supplying the feedback of step e) to step a) and repeating steps a) to f).

19. A method for tracking with a digital phase-locked loop of at least third order the phase of a signal supplied in the form of digital samples, the method comprising the steps of:

a) acquiring loop lock by analytically initializing the loop;

b) generating counter-rotation phase responsive to feedback;

c) generating a counter-rotation signal in which said counter-rotation phase is subtracted from the said phase of said signal;

d) generating a measure of difference in said phase of said signal and said counter-rotation phase wherein said measure is responsive to at least one counter-rotated signal;

e) using a loop filter responsive to phase-difference measure to generate said feedback; and f) supplying the feedback of step e) to step b) and repeating steps b) to f).

20. A method for tracking with a digital phase-locked loop characterized by a loop phase, the phase of a signal supplied in the form of digital samples, the method comprising the steps of:

a) acquiring loop lock of said signal by analytically initializing the loop, including loop phase;

b) generating counter-rotation phase responsive to feedback;

c) generating a counter-rotated signal in which said counter-rotation phase is subtracted from the said phase of said signal and said;

d) generating a measure of difference in signal phase and counter-rotation phase wherein said measure is responsive to at least one counter-rotated signal;

e) using a loop filter responsive to phase-difference measure to generate said feedback; and f) supplying the feedback of step e) to step b) and repeating steps b) to f).

* * * * *